United States Patent
Suzuki et al.

(10) Patent No.: US 6,648,975 B2
(45) Date of Patent: Nov. 18, 2003

(54) METHOD AND APPARATUS FOR FABRICATING QUANTUM DOT FUNCTIONAL STRUCTURE, QUANTUM DOT FUNCTIONAL STRUCTURE, AND OPTICALLY FUNCTIONING DEVICE

(75) Inventors: Nobuyasu Suzuki, Kawasaki (JP); Toshiharu Makino, Kawasaki (JP); Yuka Yamada, Kawasaki (JP); Takehito Yoshida, Kawasaki (JP); Takafumi Seto, Tsukuba (JP); Nobuhiro Aya, Tsukuba (JP)

(73) Assignees: Matsushita Electric Industrial Co., Ltd., Osaka (JP); Agency of Industrial Science and Technology; Ministry of International Trade and Industry, Tokyo (JP)

( * ) Notice: Subject to any disclaimer, the term of this patent is extended or adjusted under 35 U.S.C. 154(b) by 150 days.

(21) Appl. No.: 09/784,300

(22) Filed: Feb. 16, 2001

(65) Prior Publication Data
US 2001/0031564 A1 Oct. 18, 2001

(30) Foreign Application Priority Data

Mar. 29, 2000 (JP) ..................................... P2000-091902
Jun. 29, 2000 (JP) ..................................... P2000-197367

(51) Int. Cl.⁷ ............................................. C23C 14/00
(52) U.S. Cl. .................... 118/722; 118/726; 209/127.1; 209/128; 209/129; 209/130; 96/16; 73/28.02; 73/865.5
(58) Field of Search ............................... 118/722, 726; 209/127.1, 128, 129, 130; 96/16; 73/28.02, 865.5

(56) References Cited

U.S. PATENT DOCUMENTS 4,574,004 A * 3/1986 Schmidt-Ott et al. .......... 95/79
5,431,714 A * 7/1995 Burtscher et al. ................ 95/6
5,622,567 A * 4/1997 Kojima et al. ............... 118/726
5,939,649 A * 8/1999 Boulaud et al. ........... 73/865.5
6,239,453 B1 * 5/2001 Yamada et al. ............... 257/79
6,454,862 B1 * 9/2002 Yoshida et al. ............. 118/722

FOREIGN PATENT DOCUMENTS

JP        2000-146818    *  5/2000
WO       WO97/49119     * 12/1997

OTHER PUBLICATIONS

Chrisey, "Pulsed Laser Deposition of Thin Films", John Wiley & Sons, Inc., New York, 1994, pp. 115–165.*

* cited by examiner

Primary Examiner—Richard Bueker
(74) Attorney, Agent, or Firm—Browdy and Neimark, P.L.L.C.

(57) ABSTRACT

The present invention is to fabricate a quantum dot functional structure having ultra-fine particles homogeneously distributed in a transparent medium by efficiently fabricating high-purity ultra-fine particles having a single particle diameter and uniform structure and depositing the ultra-fine particles onto a substrate in conjunction with the transparent medium. For these purposes, an apparatus for fabricating a quantum dot functional structure is provided. The apparatus comprises: an ultra-fine particle generating chamber for generating high-purity ultra-fine particles by exciting a semiconductor target with pulsed laser light in a low-pressure rare gas atmosphere, and then by allowing the semiconductor target to be detached or ejected by ablation reaction and condensed and grown in the gas; an ultra-fine particle classifying chamber for classifying the ultra-file particles; a depositing chamber for depositing the high-purity semiconductor ultra-fine particles and the transparent medium by exciting a transparent medium target with excimer laser light at the same time or alternately when the high-purity semiconductor ultra-fine particles are collected onto the substrate, and by collecting the substance generated through ablation reaction onto the substrate; and a carrier gas exhaust system.

21 Claims, 13 Drawing Sheets

METHOD AND APPARATUS FOR FABRICATING QUANTUM DOT FUNCTIONAL STRUCTURE, QUANTUM DOT FUNCTIONAL STRUCTURE, AND OPTICALLY FUNCTIONING DEVICE

BACKGROUND OF THE INVENTION

1. Field of the Invention

The present invention relates to methods and apparatuses for fabricating quantum dot functional structures, quantum dot functional structures, and optically functioning devices. More particularly, the present invention relates to a method and an apparatus for fabricating a quantum dot functional structure, a quantum dot functional structure, and an optically functioning device, which provide the following outstanding features. The features make it possible to control the diameter of and alleviate the contamination of ultra-fine particles that are expected to provide various functions resulting from the quantum size effects. The features also make it possible to provide an improved efficiency for the optically functioning device fabricated using a quantum dot functional structure, in the transparent medium of which the ultra-fine particles are distributed homogeneously.

2. Description of the Prior Art

To employ semiconductor ultra-fine particles formed of Si families of IV materials for use in an optically functioning device that can emit light in the visible spectrum, it is indispensable to provide spherical ultra-fine particles which are controlled on the order of one nanometer in diameter. Moreover, the laser ablation method is preferably applied to the fabrication of the ultra-fine particles on the order of one nanometer in diameter.

For example, FIG. 1 is a conceptual view depicting an apparatus, disclosed in Japanese Patent Disclosure No. 9-275075, for applying the laser ablation method to a conventional target material to fabricate ultra-fine particles by deposition.

Referring to FIG. 1, a laser light beam is emitted from an excimer laser source 1 and travels through an optical system constituted by a slit 2, a condenser lens 3, a mirror 4, and a laser light inlet window 5 to be guided into a vacuum reaction chamber 6, where the laser light beam is focused on and thus radiates the surface of a target material 8 placed in a target holder 7, which is arranged inside the vacuum reaction chamber 6.

In addition, there is arranged a deposition substrate 9 in a direction normal to the surface of the target material 8. Substances detached or ejected from the target material 8 by laser ablation are captured or deposited on the deposition substrate 9.

An explanation will be given below in more detail to a case where semiconductor ultra-fine particles are fabricated with Si being employed as the target material in the apparatus configured as described above.

First, the vacuum reaction chamber 6 is pumped down to an ultra-high vacuum of pressure $1 \times 10^{-8}$ Torr by means of an ultra-high vacuum exhaust system 10, which is mainly constituted by a turbo-molecular pump, and then the ultra-high vacuum exhaust system 10 is closed.

Subsequently, a helium (He) gas is introduced through a rare-gas guide line 11 into the vacuum reaction chamber 6. The vacuum reaction chamber 6 is held at a constant pressure (of 1.0 to 20.0 Torr) with the low-pressure rare gas (He), the flow of which is controlled by means of a mass-flow controller 12 and which is differentially exhausted by means of a differential exhaust system 13 mainly consisting of a dry rotary pump. In the He gas atmosphere kept at a pressure of a few Torr, the surface of the target material is radiated with a laser light beam of a high-energy density (e.g., 1.0 J/cm$^2$ or greater) to cause the substances to be detached or ejected from the target material.

The detached substance gives kinetic energy to the surrounding gas molecules, which are in turn urged to condense and grow in the gas atmosphere into ultra-fine particles of a few to a few tens of nanometers in diameter, the ultra-fine particles being deposited on the deposition substrate 9.

Originally, since the IV-group semiconductors are an indirect bandgap material, their bandgap transitions cannot be dispensed with phonons. The materials naturally cause much heat to be generated in their recombination, thus providing significantly decreased radiative recombination probability. However, the material shaped in ultra-fine particles having a diameter of a few nanometers causes the wave number selection rule to be relaxed in bandgap transitions and the oscillator strength to be increased. This in turn increases the probability of occurrence of radiative electron-hole pair recombination, thereby making it possible to provide intense light emission.

Here, the wavelength of emitted light (i.e., the energy of emitted photons) is controlled by making use of an increase in absorption edge emission energy (corresponding to bandgap Eg) provided by the quantum confinement effect resulted from a decrease in diameter of ultra-fine particles. FIG. 2 is an explanatory graph showing the correlation between the diameter of the aforementioned ultra-fine particles and the absorption edge emission energy thereof.

That is, to emit light at a single wavelength, it is indispensable to make the diameter of the ultra-fine particles uniform. If ultra-fine particles of a diameter corresponding to the emission wavelength can be generated and deposited within as narrow a diameter distribution as possible, it is made possible to fabricate an optically functioning device for emitting light of a single color.

As described in the aforementioned prior art, it is required to generate and deposit ultra-fine particles having a particle diameter distribution controlled to provide a single diameter of a few nanometers in order to fabricate an optically functioning device for emitting light at a single wavelength using semiconductor ultra-fine particles.

The prior art makes it possible to control the mean particle diameter by selecting as appropriate the pressure of an atmospheric rare gas or the distance between the target material and the deposition substrate. However, the prior art provides a still broad particle diameter distribution. Thus, it is difficult to obtain semiconductor ultra-fine particles of a uniform diameter distribution having, for example, a geometric standard deviation σg of 1.2 or less.

That is, this means that more aggressive particle diameter control is required. In addition, nm-sized ultra-fine particles are very sensitive to the contamination of impurities or defects due to their high surface atom ratio (e.g., about 40% at a particle diameter of 5 nm).

That is, it is required to provide a clean and damage-less process as a method for generating and depositing the particles. Moreover, adhering and depositing semiconductor ultra-fine particles directly onto a deposition substrate as in the prior art would tend to result in a thin film of a porous structure formed of a deposit of ultra-fine particles.

Suppose that electrodes are connected to such a porous structure to allow it to function as an optically functioning device. In this case, it may be required to optimize the structure somehow. On the other hand, in order to derive the quantum size effect originally provided for spherical ultra-fine particles to implement a new optical function representative of light emission, further optimized shape and structure may be required such as a structure having particles distributed homogeneously in a stable transparent medium.

In addition, since nm-sized ultra-fine particles have a very sensitive surface as described above, it may become necessary to form a quantum dot functional structure having the particles being homogeneously distributed in a stable transparent medium.

In addition, in order to obtain fine particles having a specified particle diameter, a fine particle classifier may be used for classifying the diameter of fine particles using the mobility which is dependent on the particle diameter. Such a fine particle classifier has been used for performance test of high-performance air filters for collecting and separating sub-micron fine particles with high efficiency, and for generating standard fine particles and measuring the particle diameter upon monitoring of cleaned atmosphere. The mobility employed for classifying the diameter of particles includes mainly the electrical mobility of charged particles in an electro-static field and the dynamic mobility caused by gravitational force. In addition, the aforementioned fine particle classifier has two main structures: a double cylinder and a disk type structure.

FIG. 3 is a schematic view illustrating the structure of a prior-art differential electrical mobility classifier, introduced in Japanese Journal of Aerosol Research Vol.2, No.2, p106 (1987) or in Japanese Journal of Powder Engineering Society Vol.21, No.12, p753 (1984). This differential electrical mobility classifier has a double cylindrical structure comprising an outer cylinder (of radius R1) 19 and an inner cylinder (of radius R2) 20 disposed inside the outer cylinder 19 concentrically with the outer cylinder 19. Referring to FIG. 3, charged fine particles 21 are transported by a carrier gas 22 to flow into the double cylinder classifier from the upper and portion thereof to be mixed with clean air or a sheath gas 23 flowing therein. The mixture gas of the charged fine particles 21 and the sheath gas 23 flows as a laminar flow over a length of L through the double cylinder portion. An electrostatic field is applied to this double cylinder portion with a direct current power supply 24 in a direction perpendicular to the flow of said mixture gas. This causes the charged fine particles 21 to draw an orbit in accordance with the electrical mobility of each particle. Since said electrical mobility is dependent on the diameter of fine particles, only those fine particles having a specific diameter arrive at a lower slit 25 and then are classified to be taken out of a carrier gas exhaust vent 26. The fine particles of other diameters are exhausted from a sheath gas exhaust vent 27 in conjunction with the sheath gas 23 or caused to move to and adhere to an inner collector electrode 28.

On the other hand, as a prior art fine particle classifier, a dynamic mobility classifier having a disk structure is disclosed in Japanese Patent Disclosure No. 9-269288. FIG. 4 is a schematic view illustrating the structure of the dynamic mobility classifier of the aforementioned disk type.

This disk-type dynamic mobility classifier comprises a disk-shaped upper disk 31, a disk-shaped lower disk 32 disposed opposite to and spaced apart by a predetermined distance from the upper disk 31, and a particle collector portion 33 attached to the lower disk 32 and disposed opposite to the upper disk 31. There is formed a cylindrical central suction duct 34, having an opening at one end thereof, on the central portion of the upper disk 31. There are formed a plurality of holes or slits 35 for introducing a carrier gas in the vicinity of the rim portion of the disk in the outward radial direction from the central suction duct 34. The lower disk 32 is provided with substantially the same diameter as that of the upper disk 31 and disposed generally in concentric relationship therewith. There are formed a plurality of holes or slits 36 for emitting a carrier gas on a portion apart by a predetermined distance in the outward radial direction from the center of the lower disk 32. The slits 35 provided on the upper disk 31 and the slits 36 provided on the lower disk 32 are a plurality of slits formed in an annular shape along a predetermined circumference, spaced apart at certain intervals. The distance radially outward from the center of the disk to the position of the slits 36 provided on the lower disk 32 is designed to be less than the distance radially outward from the center of the disk to the slits 35 provided on the upper disk 31. Between the upper disc 31 and the lower disk 32, there is defined a space or a classifying region 37. On the central portion of the particle collector portion 33, there is formed a cylindrical withdrawal duct 38 having an opening at one end thereof. The particle collector portion 33 is adapted to discharge classified fine particles from the withdrawal duct 38 in conjunction with the carrier gas.

Referring to FIG. 4, the classifying region 37 is formed in a space defined between the upper disk 31 and the lower disk 32, arranged to be concentric and parallel to each other. A sheath gas or an air flow 39 is introduced into the classifying region 37 from the periphery of the upper and lower disks 31, 32, being supplied from the outer rim inwardly in the radial direction. The air flow 39 takes place as a centripetal laminar flow through the classifying region 37 and is exhausted from the central suction duct 34 (indicated by arrow A1 in FIG. 4). Fine particles 40 are transported with a carrier gas 41 to be guided from the slits 35 provided on the upper disk 31 into the classifying region 37. The fine particles 40, which have been guided from the slits 35 provided on the upper disk 31 into the classifying region 37, are moved with the air flow 39 toward the center axis as well as drop from the upper disk 31 toward the lower disk 32 due to the gravitational field. Since the drop speed is dependent on the diameter of the fine particles 40, only those fine particles having a certain diameter are allowed to reach the slits 36 arranged on the lower disk 32, thus being classified and taken out of the withdrawal duct 38 (indicated by arrow A2 in FIG. 4). The particles having other diameters are exhausted from the central suction duct 34 in conjunction with the air flow or moved to the lower disk 32 to adhere to the surface thereof.

In the field of such fine particle classification technology, known is that the physical properties of ultra-fine particles having diameters from a few to a few tens of nanometers vary depending on the particle diameter. For example, the energy gap of semiconductor ultra-fine particles increases as the particle diameter decreases. Attempts have been made to create new devices by making use of the physical properties of the aforementioned semiconductor ultra-fine particles. As a substance for forming the aforementioned new device, Si has received attention. In this context, attempts have been made to create ultra-fine particles of Si having diameters from a few to a few tens of nanometers by making use of the pulse laser ablation in a rare gas. To create a new device employing the Si ultra-fine particles, it is necessary to classify the Si ultra-fine particles having various diameters on the order of a few to a few tens of nanometers and thus extract those Si ultra-fine particles having a narrow particle diameter distribution enough to regard the particles as having a single diameter. In addition, the mean particle diameter of the Si ultra-fine particles to be classified can be preferably varied.

On the other hand, the prior art disk type dynamic mobility classifier shown in FIG. 4 is adapted to classify fine particles having generally sub-micron diameters, employing the gravitational field for classifying the particle diameter. Since the gravitational field is constant, it is necessary to vary the flow rate of the air flow 39 in order to vary the mean particle diameter of the ultra-fine particles being classified. A variation in mean particle diameter of nm-sized ultra-fine particles requires a fine variation in flow rate of the aforementioned air flow 39. It is extremely difficult to control this fine variation in flow rate and to stabilize the flow rate.

Furthermore, in order to classify ultra-fine particles having sub-micron or less diameters without increasing the size of the aforementioned disk type dynamic mobility classifier (i.e., without increasing the projective distance of the annually formed slits 35, 36), it is necessary to apply a force greater in magnitude than the gravitational force to the ultra-fine particles in a direction perpendicular to a sheath gas flow or the air flow 39 (in the direction from the upper disk 31 to the lower disk 32) in the classifying region 37.

In addition, as a method for improving the classification resolution of the ultra-fine particles, such a technique is available that increases the classifying region from one stage to multiple stages to increase the number of times of classification. Referring to the double cylinder classifier shown in FIG. 3, for example, the double cylinder classifier described in the Japanese Journal of Powder Engineering Society Vol.21, No.12, p753 (1984) has the dimensions of the classifying region of L=400 mm, R2=15 mm, and R1=25 mm. In this context, suppose a cylindrical classifying region is further added to the outer periphery of the aforementioned double cylinder classifier to provide multiple stages of the classifying region. In this case, the overall dimensions of the classifier would be significantly increased. Therefore, it is necessary to employ a structure other than that of the double cylinder type to make the overall dimensions of the classifier small.

SUMMARY OF THE INVENTION

In order to solve the aforementioned prior art problems, the apparatus for fabricating a quantum dot functional structure according to the present invention is constructed as follows. That is, the apparatus comprises a fine particle generating chamber for generating ultra-fine particles by laser ablation and a fine particle classifying chamber for classifying the ultra-fine particles according to their particle diameters. The apparatus also comprises a transparent medium generating chamber for generating a transparent medium by laser ablation and a depositing chamber for depositing the ultra-fine particles onto a substrate and embedding the particles in the transparent medium at the same time.

With this apparatus, it is made possible to efficiently fabricate high-purity ultra-fine particles having a single particle diameter and uniform structure with their contamination and damage being alleviated. It is also made possible to deposit the particles onto the substrate in conjunction with the transparent medium and thus fabricate an optically functioning device employing, as an active layer, a quantum dot functional structure having the ultra-fine particles homogeneously distributed in the transparent medium.

As various embodiments according to the present invention configured as described above, the present invention provides an apparatus for fabricating a quantum dot functional structure characterized by being constructed as follows. That is, the apparatus comprises a fine particle generating chamber for generating fine particles and a fins particle classifying chamber for classifying fine particle generated in the fine particle generating chamber according to a desired particle diameter in a gas. The apparatus also comprises gas exhaust means for exhausting a ads for transporting the fine particles and transparent medium generating means for generating a transparent medium. The apparatus further comprises a depositing chamber for collecting fine particles classified in the fine particle classifying chamber onto a substrate as well as for collecting a transparent medium generated by the transparent medium generating means onto the substrate and for depositing the classified fine particles and the transparent medium onto the substrate. This makes it possible to efficiently fabricate high-purity ultra-fine particles having a single particle diameter and uniform structure with their contamination and damage being alleviated. It is also made possible to deposit the particles onto the substrate in conjunction with the transparent medium at the same time and thus fabricate an optically functioning device employing, as an active layer, a quantum dot functional structure having the ultra-fine particles homogeneously distributed in the transparent medium.

The present invention also provides an apparatus for fabricating a quantum dot functional structure, characterized by further comprising first transparent medium generating means arranged in the depositing chamber, and a second independent transparent medium generating chamber as the transparent medium generating means. For example, this can prevent fine particles of a material susceptible to oxidation from being oxidized when such a material is used as the transparent medium that can make the atmosphere near the deposition substrate oxidative upon generation of the transparent medium. Thus, the present invention can extend the range of selection of materials for fabricating a quantum dot functional structure.

The present invention also provides an apparatus for fabricating a quantum dot functional structure, characterized in that the fine particle generating chamber, the fine particle classifying chamber, and a transport path of fine particles in the depositing chamber are constructed on a straight line. Thus, the apparatus can prevent the exhaust conductance of a transport path from being reduced upon transportation of ultra-fine particles in a gas and the ultra-fine particles from being deposited in the transport path upon transportation of the particles, thereby leading to an improvement in yield of the particles.

The present invention also provides an apparatus for fabricating a quantum dot functional structure, characterized in that the pressure of the fine particle generating chamber and the pressure of the depositing chamber are controlled independently. Thus, the apparatus can control with accuracy the pressure for generating the ultra-fine particles and the transparent medium at the optimum value for each material, thereby making it possible to control with accuracy the structure and physical properties of the quantum dot functional structure.

The present invention also provides an apparatus for fabricating a quantum dot functional structure, characterized in that the gas exhaust means is controlled in accordance with the pressure of the depositing chamber. This makes it possible to provide a larger difference in pressure between the fine particle generating chamber and the depositing chamber, thereby improving the transport efficiency of the ultra-fine particles.

The present invention also provides an apparatus for fabricating a quantum dot functional structure, characterized in that the substrate in the depositing chamber is rotatable with respect to a direction of deposition of the fine particles and transparent medium. This makes it possible to improve the deposition efficiency when the ultra-fine particles and the transparent medium are alternately deposited.

The present invention also provides an apparatus for fabricating a quantum dot functional structure, characterized by further comprising a temperature control mechanism being capable of maintaining a transport path of fine particles at a constant temperature. This can prevent the ultra-fine particles from being deposited in the transport pipe by thermo-phoresis effect, also preventing the mutual cohesion of the ultra-fine particles.

The present invention also provides an apparatus for fabricating a quantum dot functional structure, characterized in that at least one of the fine particles and the transparent medium is generated using laser ablation, and a plasma plume produced upon generation is observed using a charge coupled device. The apparatus allows the laser ablation to be observed in real time, thereby making it possible to determine the stability of the laser ablation upon generation of the ultra-fine particles and transparent medium.

The present invention also provides an apparatus for fabricating a quantum dot functional structure, characterized in that at least one of the generated fine particles and the transparent medium is radiated with ultraviolet light to observe fluorescent light. The apparatus allows for observing in real time the process of generating the ultra-fine particles and the transparent medium, making it possible to efficiently capture the ultra-fine particles into the fine particle classifying chamber as well as efficiently deposit the transparent medium.

The present invention also provides a quantum dot functional structure fabricated by the aforementioned apparatus for fabricating a quantum dot functional structure. Thus, it is made possible to realize an optically functioning device employing an active layer with a structure having the ultra-fine particles homogeneously distributed in a stable transparent medium.

The present invention also provides am optically functioning device employing the aforementioned quantum dot functional structure as an active layer, thereby making it possible to improve the efficiency when compared with that of the prior art.

The present invention also provides a method for fabricating a quantum dot functional structure, characterized by comprising the steps of generating fine particles; classifying the fine particles generated according to a desired particle diameter in a gas; exhausting a gas for transporting the fine particles after the classifying step; collecting the classified fine particles onto a substrate and generating a transparent medium at the same time; and depositing the classified fine particles and the transparent medium onto the substrate at the same time. The method makes it possible to efficiently fabricate high-purity ultra-fine particles having a single particle diameter and uniform structure with their contamination and damage being alleviated. It is also made possible to deposit the particles onto the substrate in conjunction with the transparent medium at the same time and thus fabricate an optically functioning device employing, as an active layer, a quantum dot functional structure having the ultra-fine particles homogeneously distributed in the transparent medium.

The present invention also provides a method for fabricating a quantum dot functional structure, characterized in that the transparent medium is generated using, at the same time or alternately, any one of or both first transparent medium generating means, disposed in a depositing chamber for depositing the fine particles and the transparent medium, and second transparent medium generating means arranged independently. For example, this can prevent fine particles of a material susceptible to oxidation from being oxidized when such a material is used as the transparent medium that can make the atmosphere near the deposition substrate oxidative upon generation of the transparent medium. Thus, the present invention can extend the range of selection of materials for fabricating a quantum dot functional structure.

The present invention also provides a method for fabricating a quantum dot functional structure, characterized in that the fine particles and the transparent medium are controlled independently of each other so that each pressure upon generation thereof becomes optimum at the same time, and thereby generated. Thus, the method can control with accuracy the pressure for generating the ultra-fine particles and the transparent medium at the optimum value for each material, thereby making it possible to control with accuracy the structure and physical properties of the quantum dot functional structure.

The present invention also provides a method for fabricating a quantum dot functional structure, characterized in that the gas for transporting fine particles is exhausted, after the step of classifying the fine particles, in accordance with a pressure of the depositing chamber for depositing the fine particles and the transparent medium onto the substrate. This makes it possible to provide a larger difference in pressure between the fine particle generating chamber and the depositing chamber, thereby improving the transport efficiency of the ultra-fine particles.

The present invention also provides a method for fabricating a quantum dot functional structure, characterized by further comprising the step of maintaining a path of the fine particles at a constant temperature after the step of classifying the fine particles. This can prevent the ultra-fine particles from being deposited in the transport pipe by thermo-phoresis effect, also preventing the mutual cohesion of the ultra-fine particles.

The present invention also provides a method for fabricating a quantum dot functional structure, characterized by further comprising the step of observing, using a charge coupled device, a plasma plume produced when at least one of the fine particles and the transparent medium is generated using laser ablation. The method allows the laser ablation to be observed in real time, thereby making it possible to determine the stability of the laser ablation upon generation of the ultra-fine particles and transparent medium.

The present invention also provides a method for fabricating a quantum dot functional structure, characterized by further comprising the step of observing fluorescent light from the fine particles and the transparent medium, emitted when at least one of the fine particles and the transparent medium is radiated with ultraviolet light upon generation thereof. Thus, it is made possible to observe in real time the process of generating the ultra-fine particles, leading to an improved deposition efficiency.

The present invention also provides a quantum dot functional structure fabricated by the aforementioned method for fabricating a quantum dot functional structure. Thus, it is made possible to realize an optically functioning device employing an active layer with a structure having the ultra-fine particles homogeneously distributed in a stable transparent medium.

The present invention also provides an optically functioning device employing the aforementioned quantum dot functional structure as an active layer, thereby making it possible to improve the efficiency when compared with that of the prior art.

As described above, according to the present invention, nm-sized high-purity ultra-fine particles having a single diameter and uniform structure can be fabricated efficiently with their contamination and damage being alleviated and deposited on a deposition substrate. In addition, it is also made possible to fabricate an optically functioning device which employs as the active layer the quantum dot functional structure having the ultra-fine particles distributed homogeneously in the stable transparent medium.

Furthermore, as an improvement of a disk type dynamic mobility classifier that can be incorporated into the apparatus for fabricating a quantum dot functional structure, the present invention allows a direct current voltage to be applied between the upper and lower disks. This makes it possible to establish an electrostatic field in the vertical direction in a classifying region (in a direction perpendicular to an air flow). Thus, when fine particles are charged which are introduced into the aforementioned disk type dynamic mobility classifier, it is made possible to classify the charged fine particles not according to the dynamic mobility caused by the gravitational field but according to the electrical mobility caused by the electrostatic field. Increasing the direct current voltage applied between the upper and lower disks makes it possible to produce an electrostatic force that is greater than the gravitational force. This makes it possible to classify nm-sized ultra-fine particles without increasing the aforementioned disk type dynamic mobility classifier in size (without increasing the annular guide slits and the projection distance of the annular slits).

Furthermore, varying the direct current voltage applied between the upper and lower disks makes it possible to change the strength of the electrostatic field with accuracy. Thus, this also makes it possible to vary the mean particle diameter upon classification of nm-sized charged ultra-fine particles at a constant flow rate of air.

Furthermore, in the aforementioned disk type dynamic mobility classifier, the classifying region is constituted by multiple stages instead of one stage. This makes it possible to reduce the size of the overall classifier and improve the classifying resolution of nm-sized charged ultra-fine particles. More specifically, a third disk is arranged on the lower portion of the lower disk of the aforementioned disk type dynamic mobility classifier, concentrically in parallel thereto. A space between the lower disk and the third disk is employed as a second stage classifying region. In the same manner as this, a fourth disk, a fifth disk, . . . are arranged to define a third stage classifying region, a fourth stage classifying region, . . . .

As described above, according to the present invention, a disk type dynamic mobility classifier is implemented in which a direct current voltage can be applied between upper and lower disks and which is provided with a multi-stage classifying region, thereby providing a disk type ultra-fine particle classifier for classifying nm-sized ultra-fine particles with good resolution.

Accordingly, it is a first object of the present invention to provide an apparatus for fabricating a quantum dot functional structure, in which nm-sized high-purity ultra-fine particles having a single diameter and uniform structure can be fabricated efficiently with their contamination and damage being alleviated and deposited on a deposition substrate. In addition, the apparatus makes it possible to fabricate an optically functioning device which employs as the active layer the quantum dot functional structure having the ultra-fine particles distributed homogeneously in the stable transparent medium.

In addition, it is a second object of the present invention to provide an ultra-fine particle classifier which can classify nm-sized ultra-fine particles with good resolution.

BRIEF DESCRIPTION OF THE DRAWINGS

These objects and advantages of the present invention will become clear from the following description on the embodiments with reference to the accompanying drawings, wherein.

DESCRIPTION OF THE PREFERRED EMBODIMENTS (First Embodiment)

Now, an apparatus for fabricating a quantum dot functional structure according to a first embodiment of the present invention will be explained in detail with reference to FIGS. 5 to 11.

Figure 1:
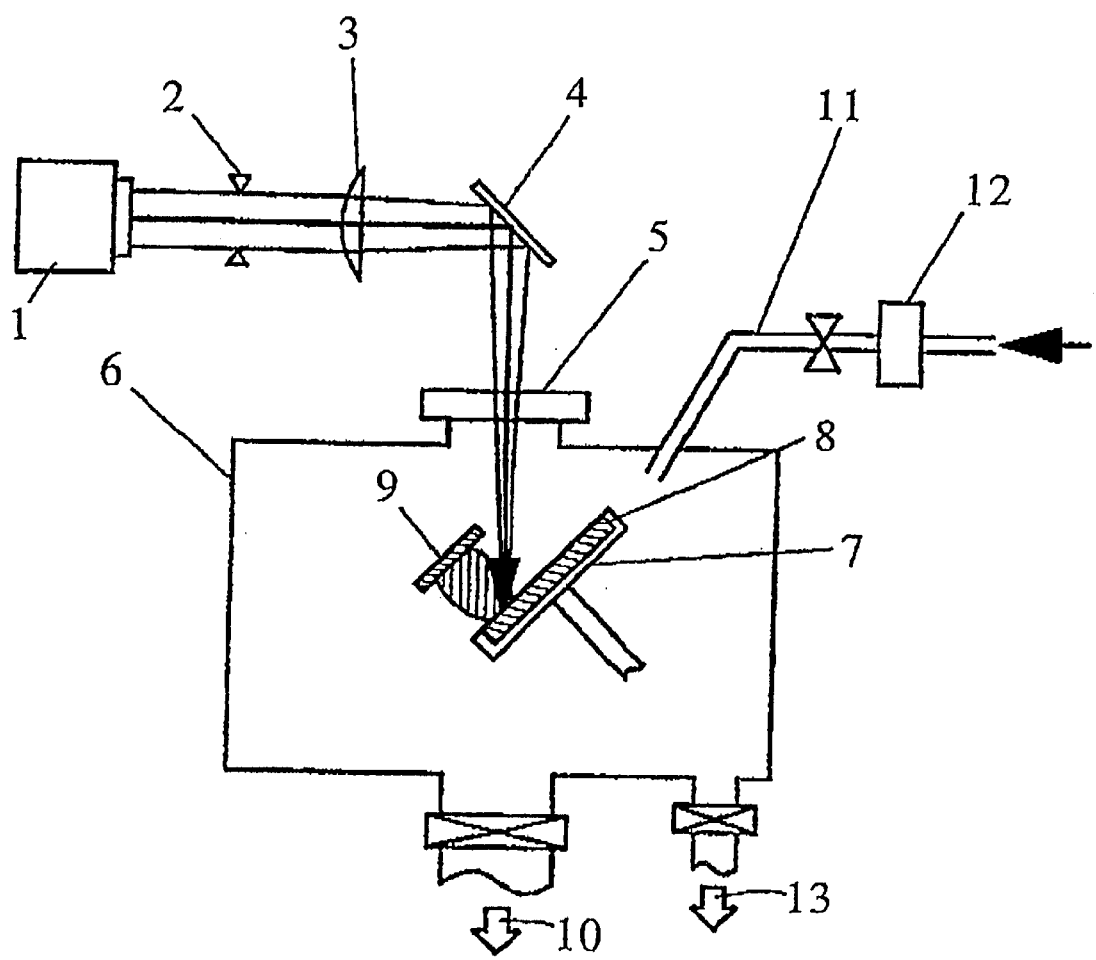
FIG. 1 is a conceptual view illustrating a prior art apparatus for fabricating and depositing ultra-fine particles.
Figure 2:
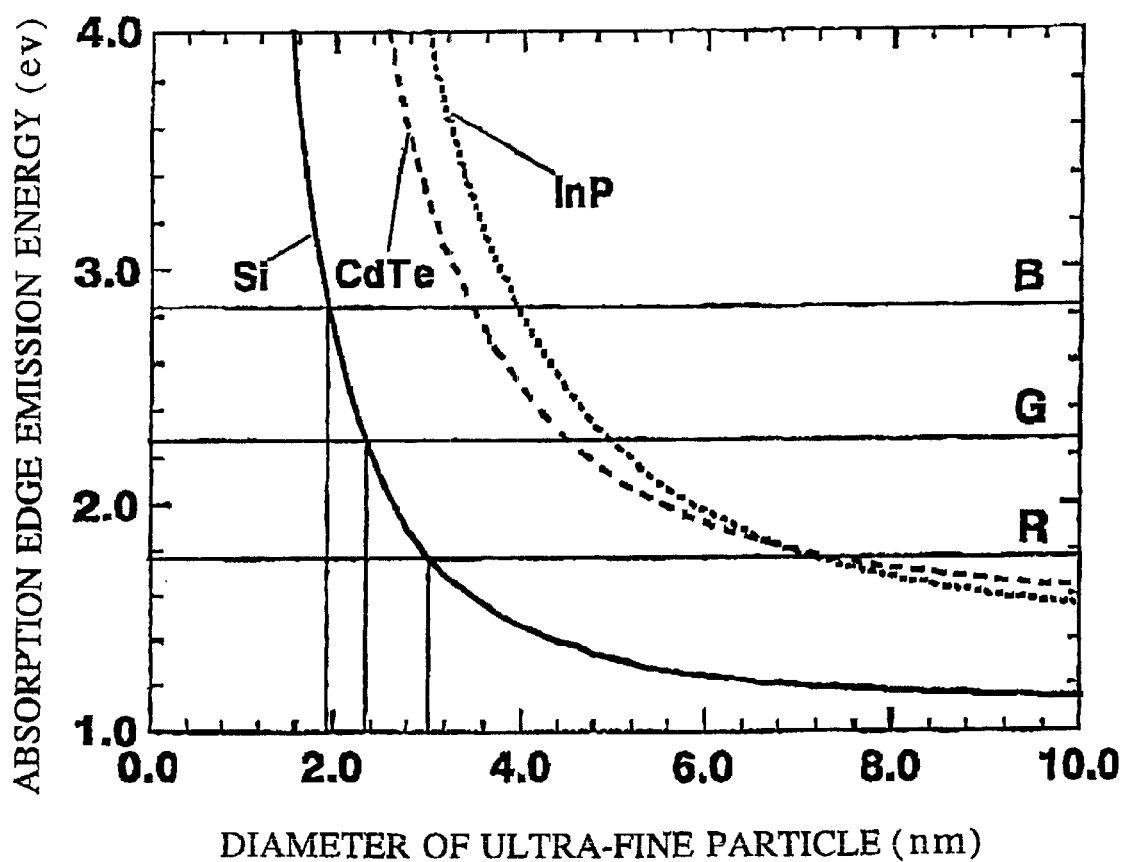
FIG. 2 is a graph illustrating the absorption edge emission energy being increased due to the quantum confinement affect with decreasing diameter of the ultra-fine particles.
Figure 3:
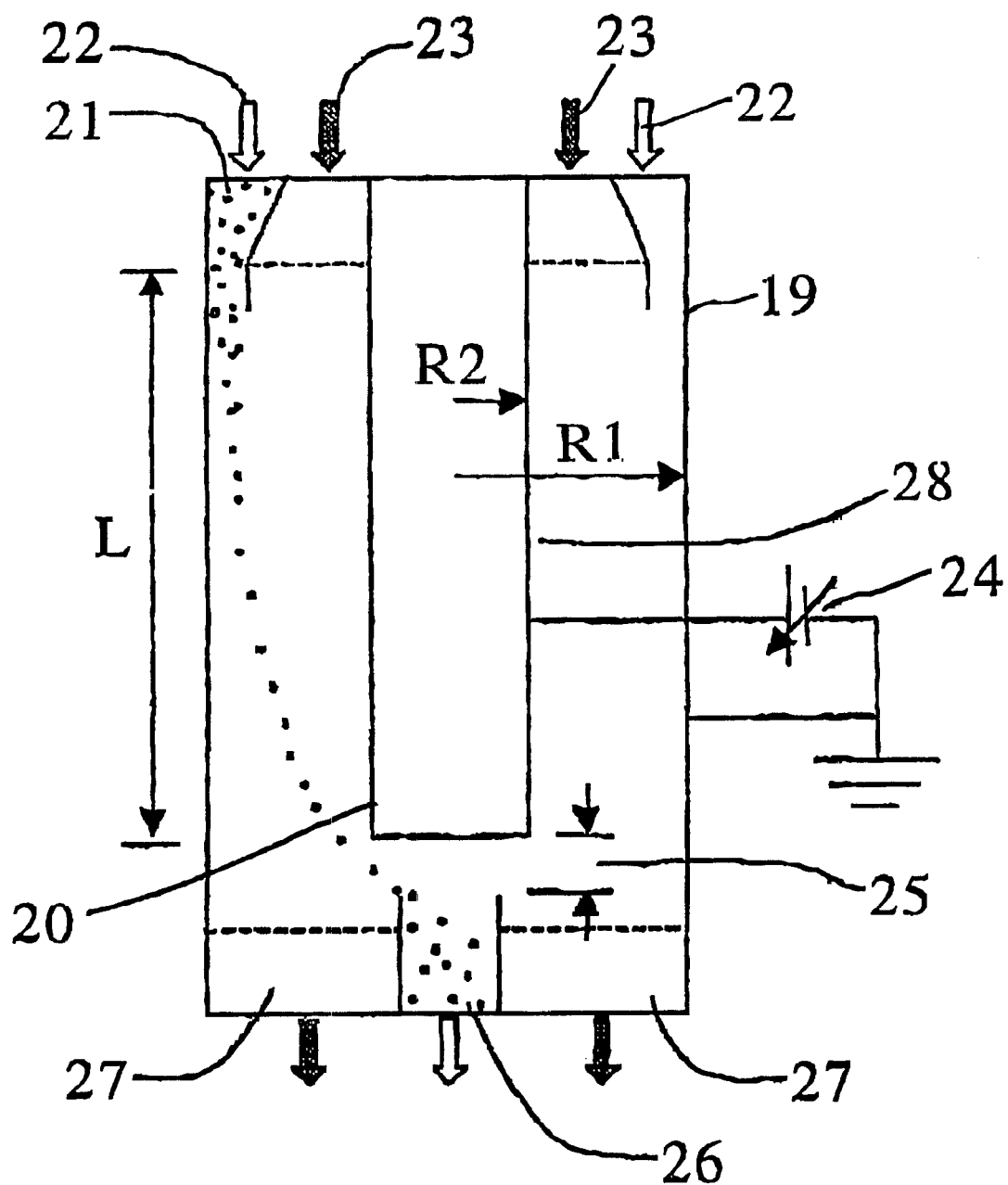
FIG. 3 is a schematic view illustrating the structure of a prior art differential electrical mobility classifier of a double cylinder structure.
Figure 4:
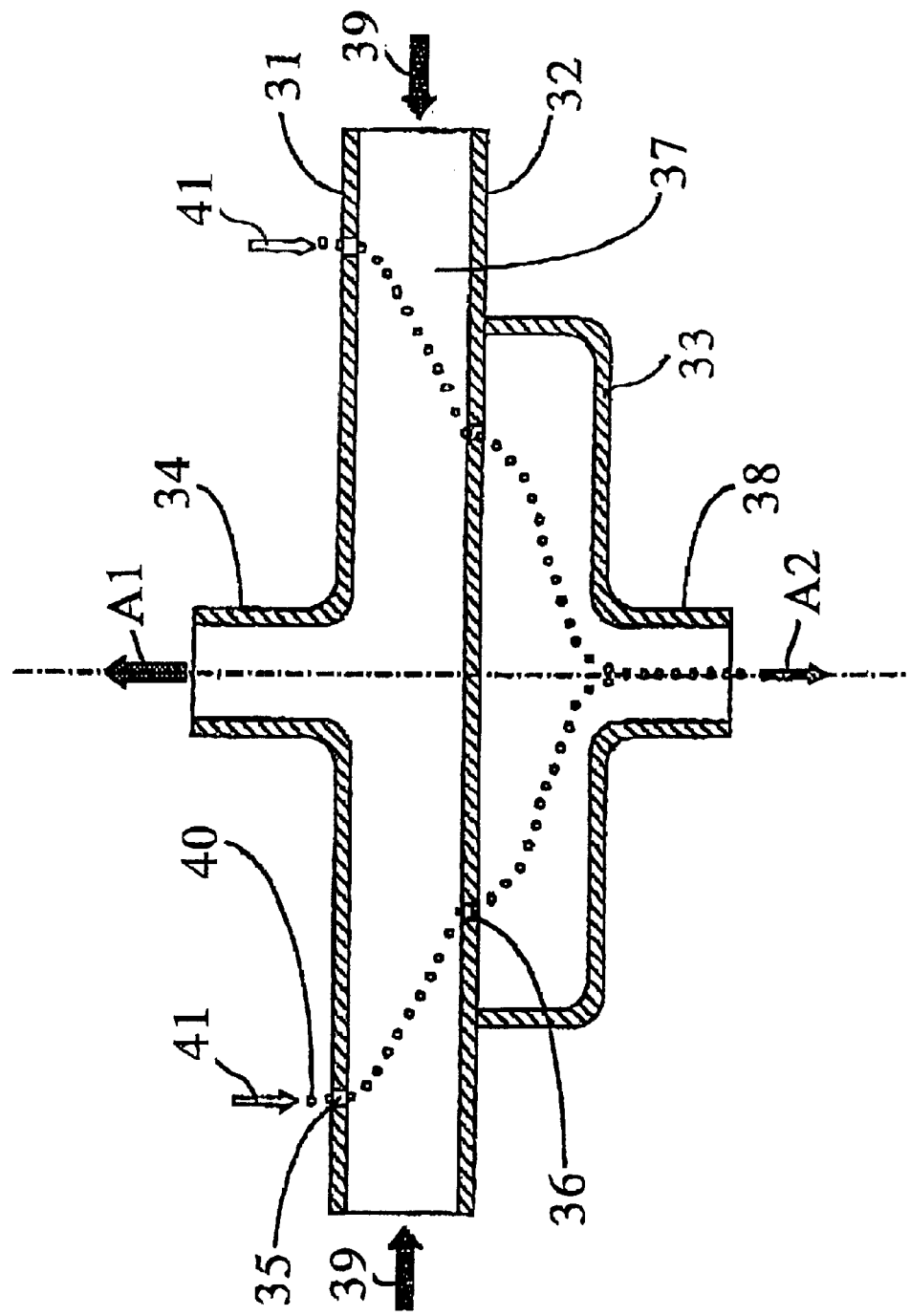
FIG. 4 is a schematic view illustrating the structure of a prior art disk type dynamic mobility classifier.
Figure 5:
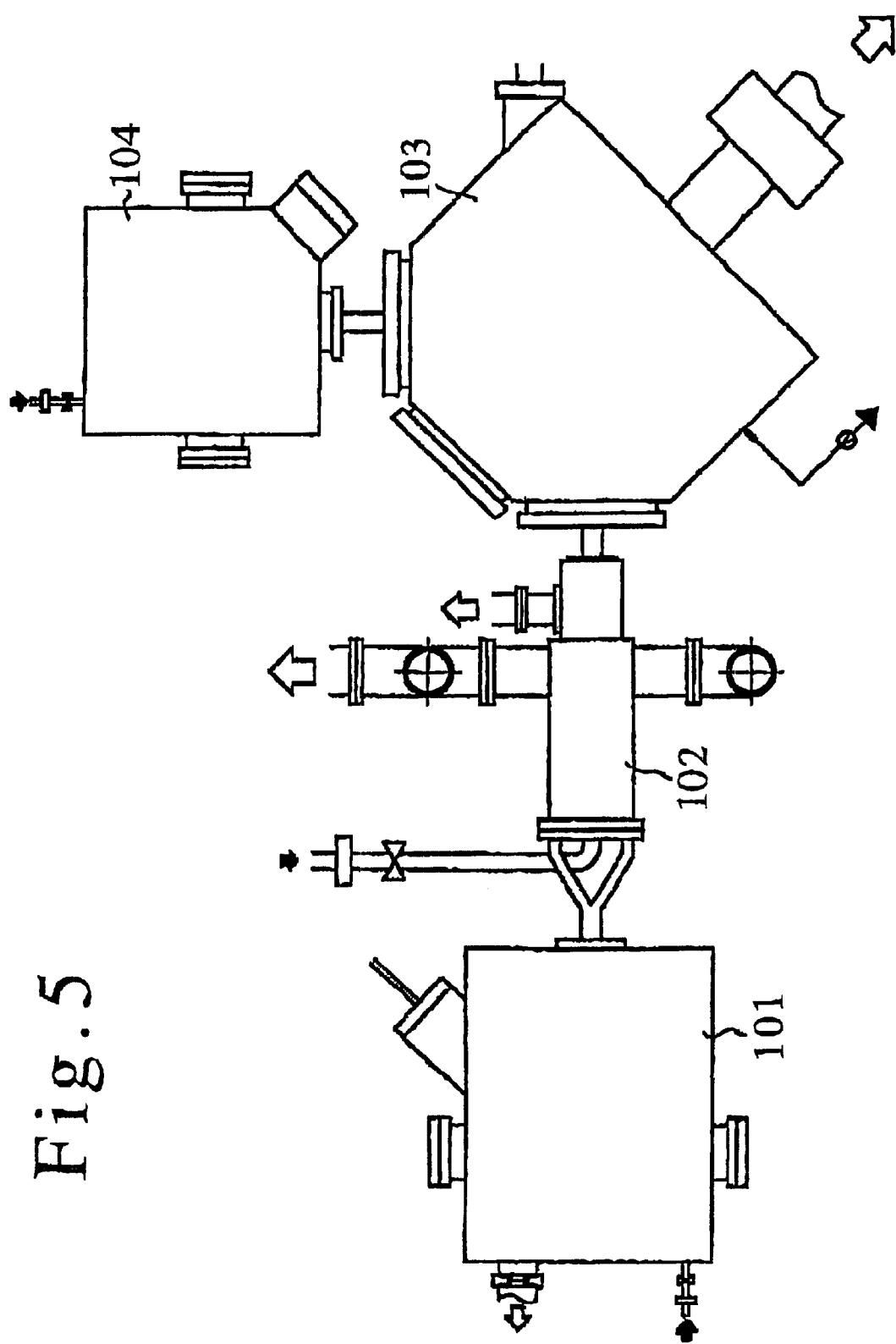
FIG. 5 is a view illustrating the overall configuration of a quantum dot functional structure fabricating apparatus according to an embodiment of the present invention.

FIG. 5 is a view illustrating the overall configuration of an apparatus for fabricating a quantum dot functional structure according to this embodiment. The apparatus for fabricating a quantum dot functional structure according to this embodiment principally comprises an ultra-fine particle generating chamber 101 for generating ultra-fine particles, an ultra-fine particle classifying chamber 102, a depositing chamber 103, and a transparent medium generating chamber 104 for generating a transparent medium. Here, the ultra-fine particle classifying chamber 102 is coupled to the ultra-fine particle generating chamber 101 to classify the ultra-fine particles generated in the ultra-fine particle generating chamber 101. The depositing chamber 103 is further coupled to the ultra-fine particle classifying chamber 102 to allow the ultra-fine particles classified in the ultra-fine particle classifying chamber 102 to be deposited.

Figure 6:
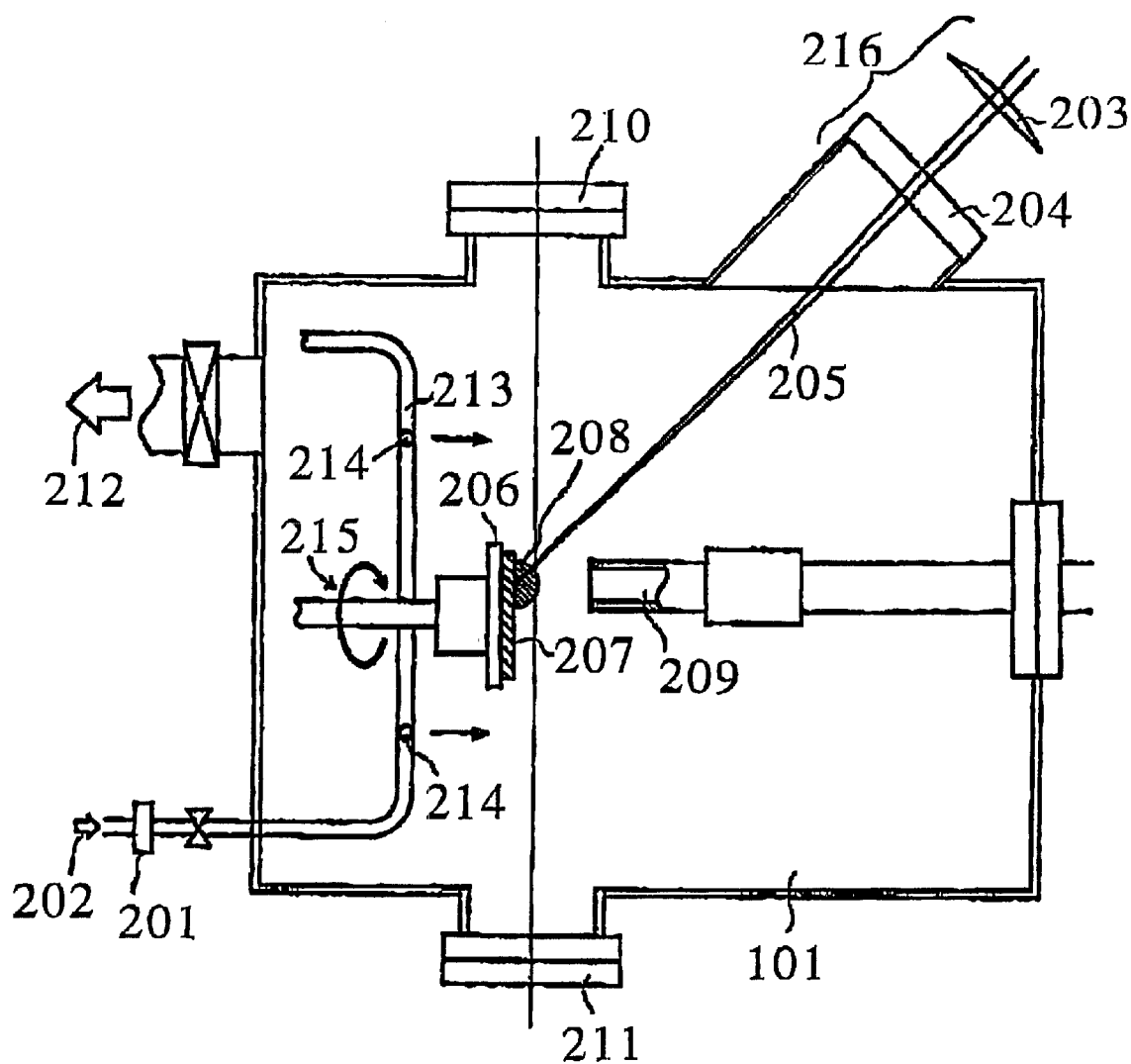
FIG. 6 is a sectional view illustrating the configuration of an ultra-fine particle generating chamber according to an embodiment of the present invention.

FIG. 6 is a sectional view illustrating the configuration of the ultra-fine particle generating chamber 101. As shown in FIG. 6, the ultra-fine particle generating chamber 101 is configured to have principally a gas guide line 213 and a self-rotating mechanism 215. Here, the gas guide line 213 introduces a carrier gas 202 (e.g., He gas of a purity of 99.9999%) into the ultra-fine particle generating chamber 101 through a mass flow controller 201 at a constant mass flow rate Qa (e.g., 1.0 (liter/minute)) via gas ejecting openings 214 disposed In an annular form. The self-rotating mechanism 215 is provided with a target holder 206 for fixedly holding a semiconductor target 207 (e.g., a single crystal Si water of surface orientation (100), diameter 50 mm, and thickness 0.625 mm). In addition, the ultra-fine particle generating chamber 101 comprises a condensing lens 203 and a laser light illumination assembly 216 provided with a laser light inlet window 204. The condensing lens 203 is arranged at an angle of 45 degrees relative to the transport path of ultra-fine particles to condense pulsed laser light (e.g., the second-order harmonic of the Nd-YGA laser of wavelength 532 nm) 205. The laser light inlet window 204 introduces the laser light condensed by the condensing lens 203 into the ultra-fine particle generating chamber 101 to radiate the semiconductor target 207 fixed on the target holder 206 with the aforementioned pulsed laser light. The ultra-fine particle generating chamber 101 comprises an ultra-fine particle intake pipe 209 extending in the same transport direction as that of growth of the ultra-fine particles of an ablation plume 208 excited by the pulsed laser light 205. The chamber 101 also comprises a pair of viewing windows 210, 211 for allowing real-time observation of the ablation plume 208, etc., and an ultra-high vacuum exhaust system 212 mainly comprising a turbo molecular pump for pumping the ultra-fine particle generating chamber 101 down to an ultra-high vacuum less than $1 \times 10^{-9}$ Torr prior to the fabrication of an optically functioning device. The ultra-fine particles generated by the excitation of the pulsed laser light 205 are fed out of the ultra-fine particle generating chamber 101 through the ultra-fine particle intake pipe 209.

Figure 7:
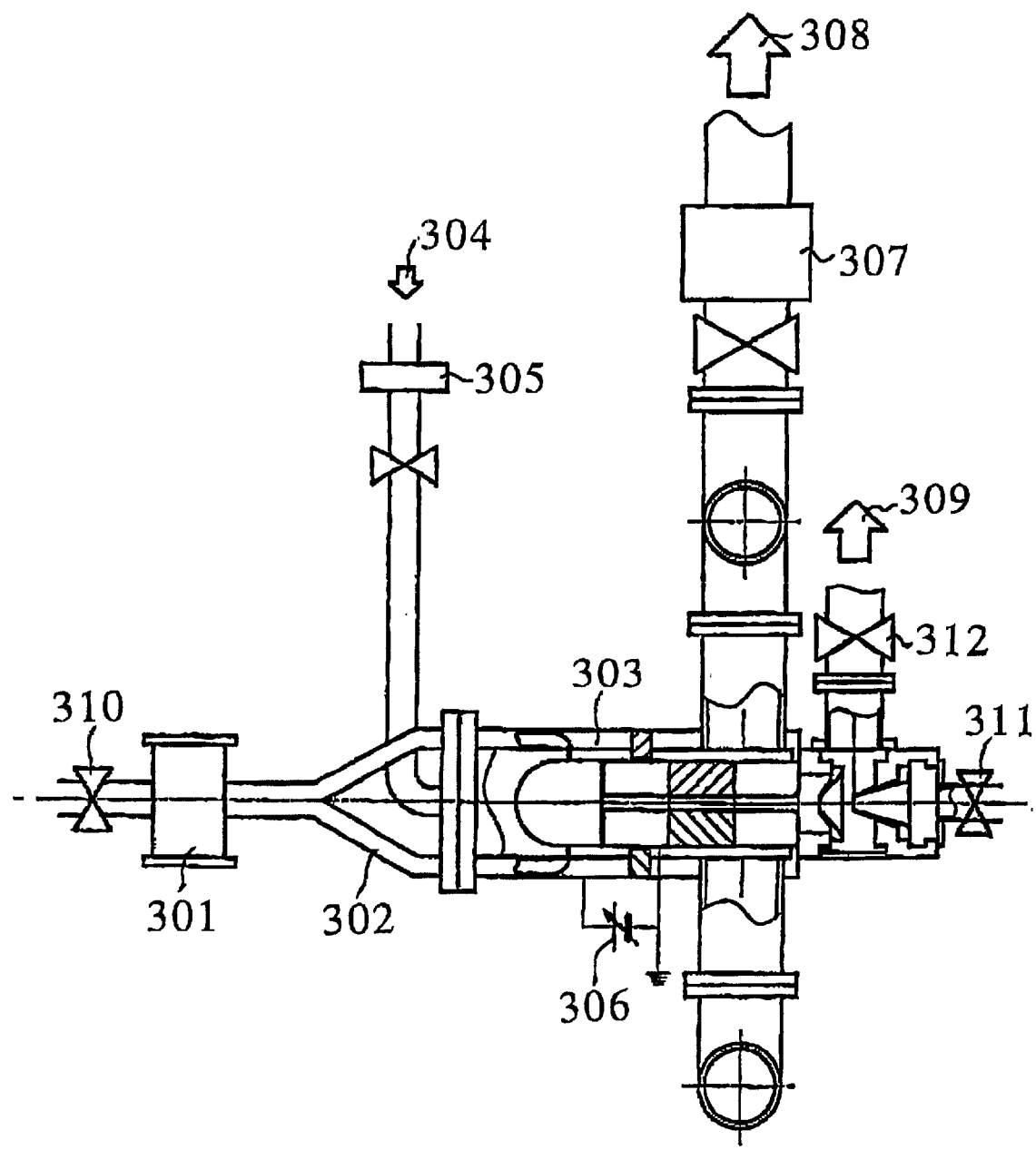
FIG. 7 is a sectional view illustrating the configuration of an ultra-fine particle classifying chamber according to an embodiment of the present invention.

FIG. 7 is a sectional view illustrating the configuration of the ultra-fine particle classifying chamber 102. As shown in FIG. 7, the ultra-fine particle classifying chamber 102 comprises principally a charging chamber 301 coupled to the ultra-fine particle generating chamber 101 to intake and charge the ultra-fine particles generated in the ultra-fine particle generating chamber 101. The chamber 102 also comprises an ultra-fine particle inlet pipe 302 for guiding the ultra-fine particles from the ultra-fins particle generating chamber 101 and a differential electrical mobility classifier 303, employed as a classifier, for classifying the ultra-fine particles fed from the ultra-fine particle inlet pipe 302. The chamber 102 further comprises a mass flow controller 305 for introducing a sheath gas 304 into the differential electrical mobility classifier 303 and a direct current power supply 306 for forming an electrostatic field between the double cylinders of the differential electrical mobility classifier 303. The chamber 102 still further comprises a sheath gas exhaust system 308 for exhausting a sheath gas and a carrier gas exhaust system 309 for exhausting part of the carrier gas 202 in conjunction with the classified ultra-fine particles classified in the differential electrical mobility classifier 303.

The charging chamber 301 charges the ultra-fine particles, which are generated in the ultra-fine particle generating chamber 101 and transported at a flow rate of Qa, with a vacuum ultraviolet light source such as an excimer lamp (an Ar2 excimer of wavelength 126 nm). The ultra-fine particles can be charged using a radioactive isotope such as americium 241 (Am 241) or both the vacuum ultraviolet light source and the radioactive isotope at the same time. The ultra-fine particle inlet pipe 302 is arranged generally in a straight line from the ultra-fine particle generating chamber 101 toward the depositing chamber 103 and branched on the way, for example, into four equal parts. In this embodiment, the differential electrical mobility classifier 303 has a double cylinder structure for receiving charged ultra-fine particles from the ultra-fine particle inlet pipe 302 to classify the ultra-fine particles according to the desired diameter. The mass flow controller 305 controllably introduces the sheath gas 304 (e.g., a He gas of a purity of 99.9999%) into the differential electrical mobility classifier 303 to form a flow of a constant mass flow rate Qc (e.g., 5 l/min) inside the differential electrical mobility classifier 303. The sheath gas exhaust system 308 is controlled by means of a mass flow meter 307 disposed at the front stage of a pump via an exhaust pipe of high conductance to exhaust the sheath gas with a helical pump or the like at the constant mass flow rate Qc. The carrier gas exhaust system 309 exhausts only part of the carrier gas 202 flowing at the mass flow rate Qa in conjunction with the classified ultra-fine particles classified with the differential electrical mobility classifier 303 using pumps mainly by means of the turbo molecular pump. In addition, the carrier gas exhaust system 309 is controlled inn accordance with the pressure of the depositing chamber, described later.

Figure 8:
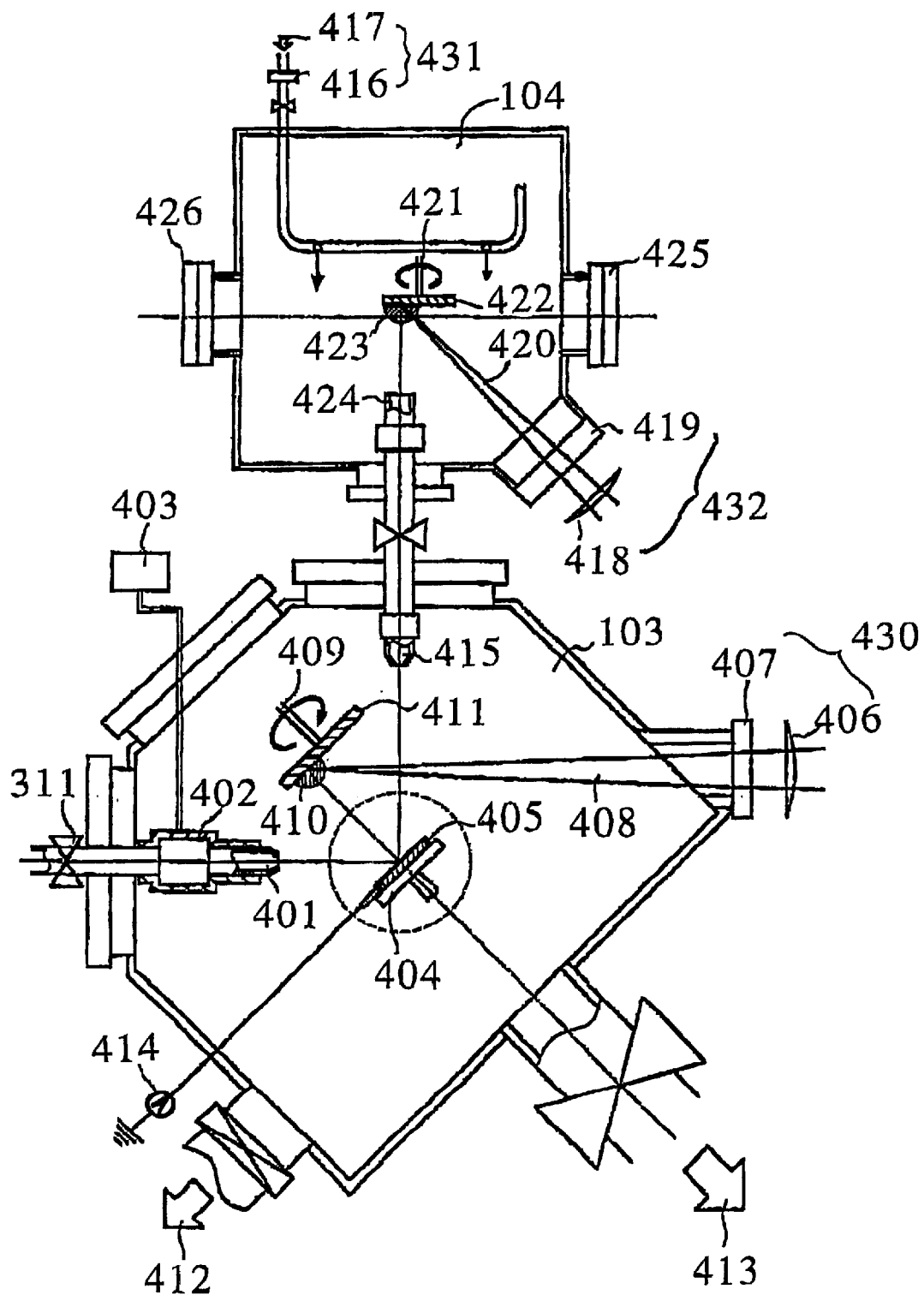
FIG. 8 is a sectional view illustrating the configuration of a depositing chamber and a transparent medium generating chamber according to an embodiment of the present invention.

FIG. 8 is a sectional view illustrating the configuration of the depositing chamber 103. As shown In FIG. 8, the depositing chamber 103 comprises principally an ultra-fine particle depositing nozzle 401 for ejecting an in-coming carrier gas containing classified ultra-fine particles and a depositing substrate holder 404. The chamber 103 also comprises a depositing substrate 405 fixed to the depositing substrate holder 404, and a laser illumination system 430 constituted by a condensing lens 406 and a laser light inlet window 407. The chamber 103 further comprises a target holder 409 and a transparent medium target 411 arranged therein, and an ultra-high vacuum exhaust system 412 for pumping the depositing chamber 103 down to an ultra-high vacuum. The chamber 103 still further comprises a depositing chamber gas exhaust system 413 for exhausting differentially the carrier gas in the depositing chamber 103, a micro-ammeter 414 for measuring the exchange of electrons between the ultra-fine particles and the depositing substrate 405 in the depositing chamber 103, and a transparent medium depositing nozzle 415 for ejecting the transparent medium transported from the transparent medium generating chamber 104.

The ultra-fine particles generated in the ultra-fine particle generating chamber 101 are classified into those of a single particle diameter in the ultra-fine particle classifying chamber 102 and thereafter the ultra-fine particle depositing nozzle 401 ejects the incoming carrier gas containing the classified ultra-fine particles. The ultra-fine particle depositing nozzle 401 is coupled with a heater 402 for maintaining the ultra-fine particle depositing nozzle at a constant temperature and a controller 403 for controlling the operation of the heater 402. The laser illumination system 430 allows excimer laser light 408 to be condensed through the condensing lens 406 and introduced into the depositing chamber 103 via the laser light inlet window 407. The target holder 409 fixes the target 411 excited by the excimer laser light 408 as well as drivingly rotates the target 411 at a constant speed (e.g., at 8 rpm).

In this embodiment, the target 411 is formed, for example, of the transparent medium target 411 (e.g., a sintered target of $In_2O_3$ having a purity of 99.99%, a diameter of 50 mm, and a thickness of 3 mm). Moreover, on the target holder 409, the target 411 is arranged in parallel to the depositing substrate 405 so as to direct the direction of growth of an ablation plume 410 excitedly irradiated with the excimer laser light 408 toward the depositing substrate 405. On the depositing substrate 405, the transparent medium generated from the target 411 radiated with the excimer laser light 408 is deposited. The ultra-high vacuum exhaust system 412 comprises mainly a turbo molecular pump for pumping the depositing chamber 103 down to a ultra-high vacuum less than $1 \times 10^{-9}$ Torr prior to the fabrication of a quantum dot functional structure. The depositing chamber gas exhaust system 413 mainly comprises a helical pump for exhausting differentially a carrier chamber 101 at a constant pressure (e.g., 4.0 Torr). The micro-ammeter 414 measures as an electric current the electrons to be exchanged when the charged ultra-fine particles classified in the depositing chamber 103 are deposited on the depositing substrate 405.

On the other hand, as shown in FIG. 8, the transparent medium generating chamber 104 principally comprises a gas guide system 431 for introducing an atmospheric rare gas 417 into the transparent medium generating chamber 104 and a laser illumination system 432 constituted by a condensing lens 418 and a laser light inlet window 419. The chamber 104 also comprises a target holder 421 and a transparent medium target 422 arranged thereon, a transparent medium intake pipe 424, and a pair of viewing windows 425, 426 for allowing real-time observation of an ablation plume 423 or the like excited by excimer laser light 420.

The gas guide system 431 introduces the atmospheric rare gas 417 (e.g., a He gas of a purity of 99.9999%) into the transparent medium generating chamber 104 at a constant mass flow rate QT (e.g., 0.5 [l/min]) via a mass flow controller 416. The target holder 412 fixes the target 422 excited by the excimer laser light 420 as well as drivingly rotates the target 422 at a constant speed (e.g., at 8 rpm). In this embodiment, the target 422 is formed, for example, of a transparent medium target (e.g., a sintered target of $In_2O_3$ having a purity of 99.99%, a diameter of 50 mm, and a thickness of 3 mm). Moreover, on the target holder 421, the transparent medium target 422 is arranged so as to direct the direction of growth of the ablation plume 423 excitedly irradiated with the excimer laser light 420 toward the depositing substrate 405. The transparent medium intake pipe 424 is arranged toward the direction of growth of the ablation plume 423 excited by the excimer laser light 420.

Figure 9:
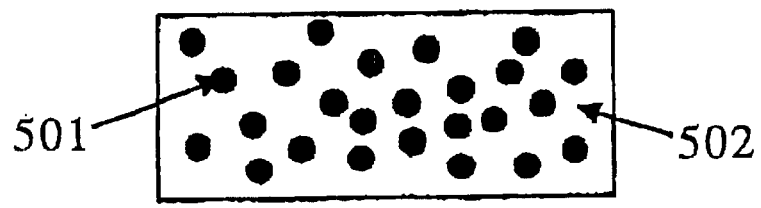
FIG. 9 is a sectional view illustrating the configuration of a quantum dot functional structure according to an embodiment of the present invention.

FIG. 9 is a sectional view illustrating the configuration of the quantum dot functional structure according to this embodiment. With reference to FIGS. 6 to 11, explanations will be given the fabrication of the quantum dot functional structure, as shown in FIG. 9, with a sectional structure where high-purity ultra-fine particles 501 of a single diameter and uniform structure are homogeneously distributed in a transparent medium 502. First, to eliminate the effect of damage, contamination or the like prior to fabricating the quantum dot functional structure, a valve 310 of FIG. 7 is closed to allow the ultra-high vacuum exhaust system 212 of FIG. 6, comprising mainly the turbo molecular pump, to pump the ultra-fine particle generating chamber 101 down to an ultra-high vacuum less than $1 \times 10^{-9}$ Torr, and thereafter the ultra-high vacuum exhaust system 212 is closed.

At the same time, the ultra-high vacuum exhaust system 412 of FIG. 8, comprising mainly the turbo molecular pump, is allowed to pump the ultra-fine particle classifying chamber 102, the depositing chamber 103, and the transparent medium generating chamber 104 down to an ultra-high vacuum less than $1 \times 10^{-9}$ Torr, and thereafter the ultra-high vacuum exhaust system 412 is closed.

Subsequently, the mass flow controller 201 of FIG. 6 is used to introduce the carrier gas 202 (a high purity rare gas, e.g., a He gas of a purity of 99.9999%) at the mass flow rate Qa (0.5[l/min] in this case) into the ultra-fine particle generating chamber 101.

Then, the valves 310, 311 of FIG. 7 are opened to control the depositing chamber gas exhaust system 413 of FIG. 8, mainly constituted by the helical pump, with reference to the pressure of the ultra-fine particle generating chamber 101, and differential exhaust is performed to maintain the ultra-fine particle generating chamber 101 at a constant pressure P1 (e.g., 10 Torr).

Here, the surface of the semiconductor target 207 is excited with thee condensed pulsed laser light 205 of FIG. 6 to produce the ablation reaction so as to completely remove the natural oxide film formed on the surface of the semiconductor target 207 and Impurities such as metallic or carbon compounds adhered to the surface of the target. Thereafter, the depositing chamber gas exhaust system 413 of FIG. 8 is closed. At this point, the lasing of the pulsed laser light 205 is at a standstill.

As described above, the natural oxide film is removed which is formed on the surface of the semiconductor target 207. It is thereby made possible to eliminate the effect exerted by the oxide film, which may contaminate and is an impurity for the semiconductor ultra-fine particle, and the metallic or carbon compounds adhered to the surface of the target or the like.

Then, the carrier gas 202 is changed in its flow rate and introduced at a constant mass glow rate Qa (1.0[l/min] under standard condition). At the same time, the mass flow controller 305 of FIG. 7 is used to introduce the sheath gas 304 (a high purity rare gas, e.g., a He gas of a purity of 99.9999%) at the mass flow rate Qc (5.0[l/min] under standard condition) into the differential electrical mobility classifier 303.

Here, the depositing chamber gas exhaust system 413 mainly constituted by the helical pump is opened to exhaust differentially the carrier gas so as to maintain the ultra-fine particle generating chamber 101 at a constant pressure P1 (e.g., 5.0 Torr). At the same time, the sheath gas exhaust system 308, mainly constituted by the helical pump and provided for the ultra-fine particle classifying chamber 102, is opened to control the sheath gas exhaust system 308 with reference to the reading of the mass flow meter 307 so as to allow the mass flow meter 307 to read 5.0[l/min], thereby exhausting the sheath gas at a constant mass flow rate Qc.

Furthermore, a valve 312 is opened at the same time to exhaust differentially only part of the carrier gas so as to maintain the depositing chamber 103 at a constant pressure P2 (e.g., 2.0 Torr) using the carrier gas exhaust system 309 controlled with reference to the pressure of the depositing chamber 103. At this point, the sum of the mass flow rate of the gases exhausted through the depositing chamber gas exhaust system 413 and the carrier gas exhaust system 309 is 1.0 [l/min], while the ultra-fine particle generating chamber is kept at a constant pressure P1 (5.0 Torr) and the depositing chamber is kept at a constant pressure P2 (2.0 Torr).

Exhaustion of gases by the aforementioned means can control the pressure of the ultra-fine particle generating chamber 101 at P1, the pressure of the depositing chamber at P2, and the exhaust mass flow rate of the sheath gas at Qc with accuracy.

Then, the pulsed laser light 205 is lased to be introduced into the ultra-fine particle generating chamber 101. At this time, in the ultra-fine particle generating chamber 101, the substance detached and ejected due to the ablation reaction from the semiconductor target 207 excited by the pulsed laser light 205 dissipates its kinetic energy into the atmospheric rare gas molecules, thereby urging the condensation and growth of the substance in the gas and thus allowing the substance to grow to ultra-fine particles of a few to a few tens of nanometers.

Figure 10:
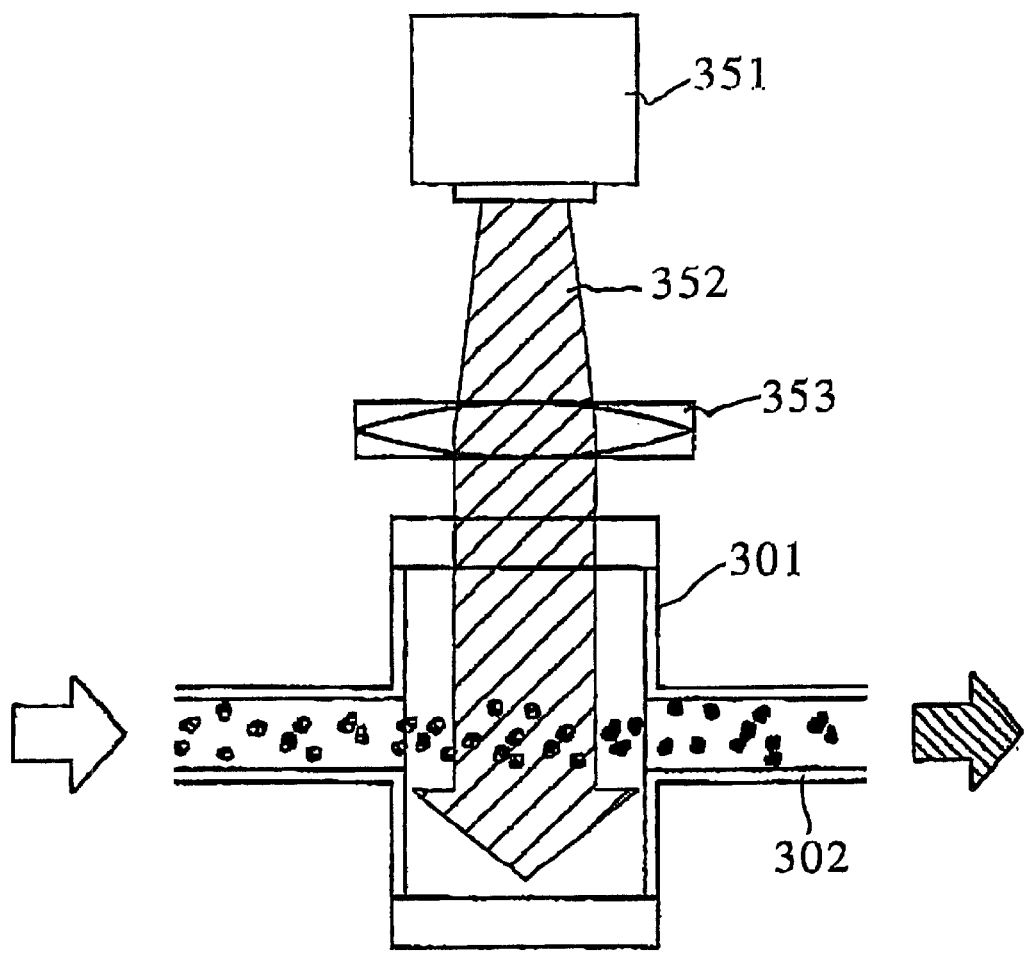
FIG. 10 is a sectional view illustrating a charging chamber according to an embodiment of the present invention.

Here, controlling and maintaining the ultra-fine particle generating chamber at a constant pressure P1 with accuracy by the aforementioned means mares it possible to allow the semiconductor ultra-fine particles to condense and grow under the optimum condition FIG. 10 is a sectional, view illustrating the configuration of the charging chamber 301 according to an embodiment of the present invention. This charging chamber 301 comprises a vacuum ultraviolet light source 351 for generating and emitting ultraviolet light, and an optical system 353 for condensing vacuum ultraviolet light 352 emitted from the vacuum ultraviolet light source 351 and for radiating the charging chamber 301 with the light. The high-purity semiconductor ultra-fine particles generated in the ultra-fine particle generating chamber 101 are transported to the charging chamber 301, configured as shown in FIG. 10, via the ultra-fine particle intake pipe 209 in conjunction with a carrier gas flowing at a constant mass flow rate Qa. The high-purity semiconductor ultra-fine particles transported to the charging chamber 301 are charged to have a single polarity with the vacuum ultraviolet light 352 emitted from the vacuum ultraviolet light source 351 and formed through the optical system 353.

The high-purity semiconductor ultra-fine particles charged to have a single polarity in the charging chamber 301 flow into the differential electrical mobility classifier 303 via the ultra-fine particle inlet pipe 302, which is arranged at four equal intervals spaced by 90 degrees. The high-purity semiconductor ultra-fine particles that have flown into the differential electrical mobility classifier 303 of the double cylinder type are classified according to the desired single diameter (e.g., a particle diameter of 3.7 nm) through the electrostatic field established between the inner and outer cylinders with the direct current power supply 306 (e.g., at a voltage of 2.5V).

Here, the mass flow rate of the carrier and sheath gases to be introduced through the aforementioned means and the mass flow rate of the carrier and sheath gases to be exhausted are controlled so as to be equal to eat other, respectively, thereby allowing the classification accuracy of the differential electrical mobility classifier 303 to approach a theoretical value.

Then, the high-purity semiconductor ultra-fine particles classified in the differential electrical mobility classifier 303 are transported into the depositing chamber 103 in conjunction with the carrier gas via the ultra-fine particle depositing nozzle 401 to be collect a deposited on the depositing substrate 405. In addition, the ultra-fine particle depositing nozzle 401 is controlled in temperature by means of the heater 402, which is controlled and maintained at a constant temperature (150 degrees Celsius) with the heater controller 403. This makes it possible to prevent the ultra-fine particles from depositing in the nozzle pipe by making use of the thermo-phoresis effect and thus improve the deposition efficiency.

At this time, the target 411 is excited with the excimer laser light 408, and the transparent medium ejected through the ablation reaction is collected and deposited on the depositing substrate 405 at the same time the high-purity semiconductor ultra-sine particles are collected and deposited on the depositing substrate 405.

Here, controlling and maintaining the depositing chamber at a constant pressure P2 (2.0 Torr) by the aforementioned means makes it possible to deposit the transparent medium under the optimum condition.

Furthermore, it is made possible to maintain the pressure P2 at a given value using the carrier gas exhaust system 309, which exhausts only part of the carrier gas 202 using a pump mainly by a turbo molecular pump and is controlled in accordance with the pressure P2 of the depositing chamber. This allows the difference in pressure between P1 and P2 to be made greater (P1=5.0 Torr, P2=2.0 Torr, the difference in pressure=3.0 Torr) than that achieved without the carrier gas exhaust system 309 (P1=5.0 Torr, P2=4.0 Torr, the difference in pressure=1.0 Torr), making it possible to employ the pressure difference more efficiently in the transportation of ultra-fine particles.

As described above, by collecting and depositing the classified high-purity semiconductor ultra-fine particles and the transparent medium at the same time, it is made possible to fabricate the quantum dot functional structure, as shown in FIG. 9, having a sectional structure where the high-purity ultra-fine particles 501 having a single diameter and uniform structure are homogeneously distributed in the transparent medium 502.

Incidentally, here, the high-purity semiconductor ultra-fine particles and the transparent medium are collected and deposited at the same time in the depositing chamber 103. However, first, the high-purity semiconductor ultra-fine particles may be deposited from the ultra-fine particle depositing nozzle 401 to allow a certain amount of the high-purity semiconductor ultra-fine particles to be deposited. Thereafter, the transparent medium may be deposited on the deposition substrate, thereby forming a layer structure of the ultra-fine particles and the transparent medium.

In the aforementioned procedures for fabricating the quantum dot functional structure, laser ablation is performed on the target 411 with the excimer laser light 408 in the depositing chamber 103, thereby depositing the transparent medium. Unlike these procedures, the following procedure may be employed. That is, first, the atmospheric rare gas 417 (A He gas of a purity of 99.999%) is introduced into the transparent medium generating chamber 104 at a constant mass flow rate QT (0.5 l/min) via the mass flow controller 416. Then, in the subsequent step, the transparent medium target 422 is excited with the excimer laser light 420 (ArF excimer laser of wavelength 193 nm) which is condensed through a condensing lens 418 and then introduced into the transparent medium generating chamber 104 via the laser light inlet window 419. Thereafter, in the following step, the transparent medium captured from the transparent medium intake pipe 424, which is arranged in the direction of growth of the ablation plume 423 excited with the excimer laser light 420, is ejected from the transparent medium depositing nozzle 415 in the depositing chamber 103 and thus deposited on the depositing substrate 405. As described above, upon deposition, it is made possible to prevent the oxidation of semiconductor ultra-fine particles sensitive to the ambient oxidative atmosphere by performing no laser ablation on the transparent medium in the depositing chamber 103.

Figure 11:
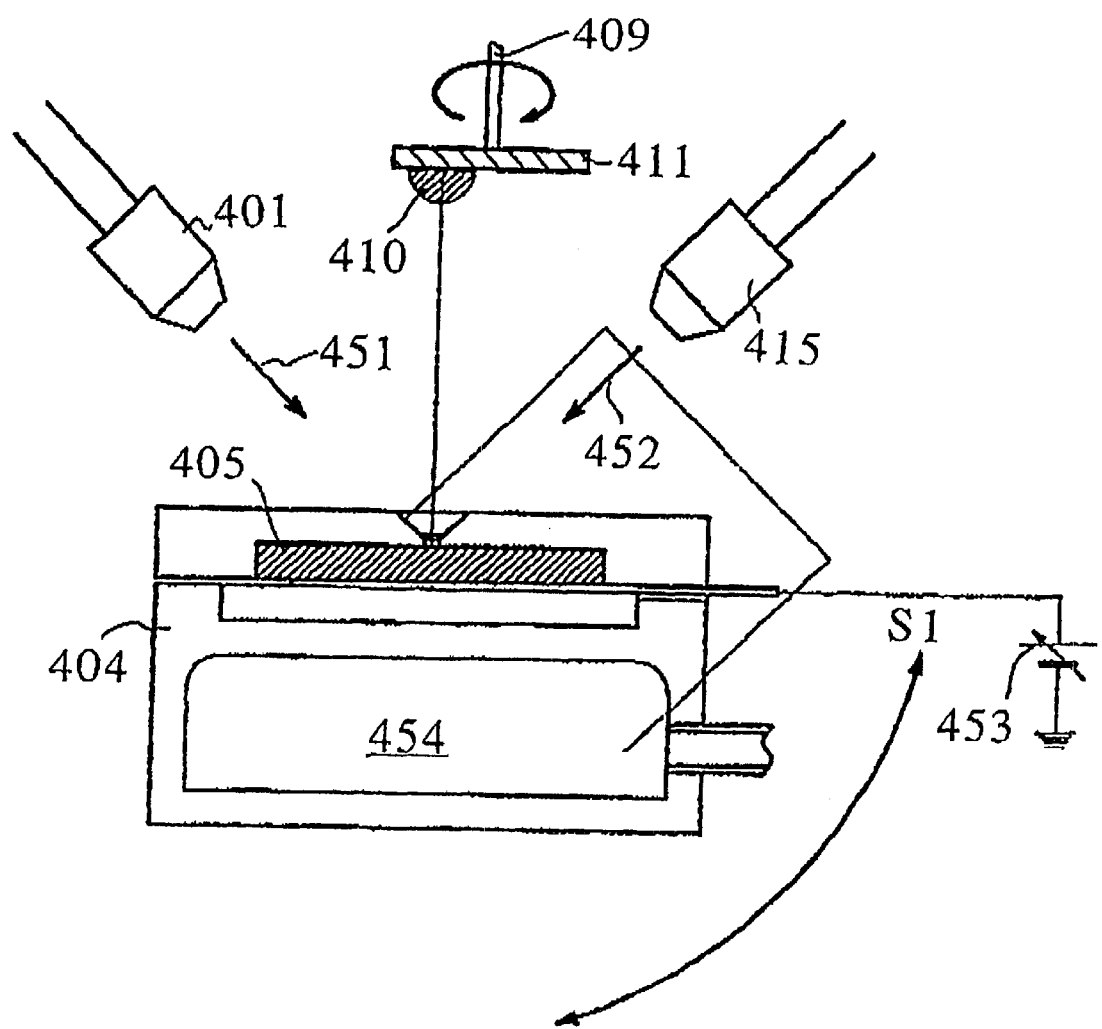
FIG. 11 is a view illustrating the configuration of another example of a holder and depositing substrate, which are used in a depositing chamber according to an embodiment of the present invention.

FIG. 11 is a view illustrating another example of the holder 404 and the depositing substrate 405 to be used in the depositing chamber 103 according to this embodiment. As shown in FIG. 11, the depositing substrate holder 404 and the depositing substrate 405 are adapted to be rotatable about the center of the depositing substrate 405 so as to be parallel or orthogonal to each of the ultra-fine particle depositing nozzle 401, the transparent medium target 411, and the transparent medium depositing nozzle 415. In addition, a direct current power supply 703 is connected to the depositing substrate 405 to apply a predetermined voltage thereto.

For example, upon alternate deposition, such a configuration allows the angle of the depositing substrate 405 to rotate from the horizontal by 45 degrees in the counterclockwise direction as shown in FIG. 11 (in the direction shown by the arrow S1) so as to be orthogonal to a deposition direction 451 of the ultra-fine particles during the deposition of the ultra-fine particles. On the other hand, upon deposition of the transparent medium, the depositing substrate 405 is made horizontal so as to be at 45 degrees to both the deposition direction 451 of the ultra-fine particles and a deposition direction 452 of the transparent medium, that is, so as to be parallel to the transparent medium target 411. It is thereby made possible to improve the deposition efficiency of the ultra-fine particles and the transparent medium and distribute the deposit homogeneously.

In addition, a bias voltage (e.g., 100V) is applied to the depositing substrate 405 with a direct current power supply 453 to introduce liquid nitrogen into a liquid nitrogen reservoir 454 and cool down the depositing substrate 405 (e.g., to −100 degrees Celsius), thereby making it possible to improve the deposition efficiency of the ultra-fine particles.

Here, upon collecting and depositing the high-purity semiconductor ultra-fine particles, the micro-ammeter 414 can be used to measure as an electric current the electrons exchanged when the classified and charged ultra-fine particles are collected and deposited on the substrate, thereby making it possible to check and control the amount of deposit of the ultra-fine particles.

As described above, it is possible to realize an apparatus for fabricating a quantum dot functional structure, which comprises the following chambers and means. That is, the apparatus comprises a fine particle generating chamber for generating fine particles, a fine particle classifying chamber for classifying the fine particles generated in the fine particle generating chamber according to the desired particle diameter in a gas, gas exhaust means for exhausting the gas that transports the fine particles, and transparent medium generating means for generating a transparent medium. The apparatus also comprises a depositing chamber for collecting the fine particles classified in the fine particle classifying chamber onto a substrate as well as collecting the transparent medium generated by the transparent medium generating means onto the substrate and depositing the classified fine particles and transparent medium onto the substrate. Using such an apparatus for fabricating a quantum dot functional structure, nm-sized high-purity ultra-fine particles having a single diameter and uniform structure can be fabricated efficiently with their contamination and damage being alleviated and deposited on a deposition substrate. In addition, it is also made, possible to fabricate an optically functioning device which employs as the active layer the quantum dot functional structure having the ultra-fine particles distributed homogeneously in the stable transparent medium.

(Second Embodiment)

Now, as a second embodiment, an explanation is given to an improved disk type ultra-fine particle classifier which can be employed for the fabrication of the quantum dot functional structure according to the aforementioned first embodiment. The first embodiment employs the differential electrical mobility classifier 303 having a double cylinder structure as the classifier. The classifier according to this embodiment is of a type different therefrom and an improved disk type ultra-fine particle classifier.

Figure 12:
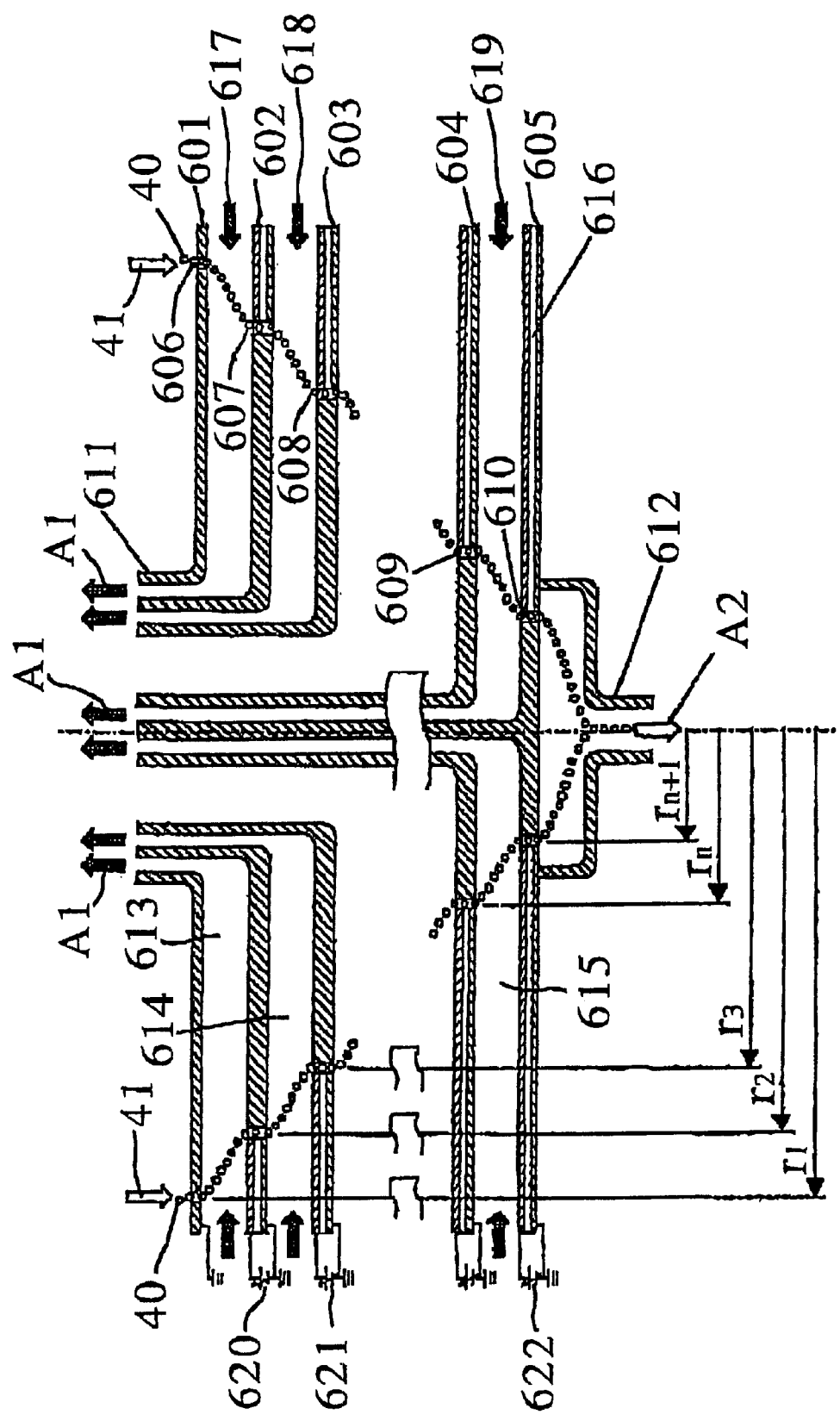
FIG. 12 is a schematic view illustrating the configuration of an improved disk type ultra-fine particle classifier, which can be employed for fabricating a quantum dot functional structure according to a second embodiment of the present invention.

FIG. 12 is a schematic sectional view illustrating the configuration of the disk type ultra-fine particle classifier according to the second embodiment of the present invention. This disk type ultra-fine particle classifier is constructed to have n+1 (where n is an integer equal to or greater than 1) disks disposed concentrically in parallel to each other. The space between a first disk 601 and a second disk 602 defines a first classifying region 613; the space between the second disk 602 and a third disk 603 defines a second classifying region 614; and similarly, the space between an nth disk 604 and an (n+1)th disk 605 defines an nth classifying region 615. The first disk 601 has annular guide slits 606 for introducing a carrier gas and ultra-fine particles into said disk type ultra-fine particle classifier at the position of radius r1. The second disk 602 has first annular slits 607 at the position of radius r2 which is less than the radius r1. The third disk 603 has second annular slits 608 at the position of radius r3 which is less than the radius r2. Similarly, the (n+1)th disk 605 has nth annular slits 610 at the position of radius r(n+1) which is less than a radius rn.

In addition, the first disk 601, the second disk 602, . . . , and the (n+1)th disk 605 each have a sheath gas exhaust vent 611 for exhausting a first sheath gas 617, a second sheath gas 616, . . . , and an nth sheath gas 619 which flow from the periphery of the disks into the first classifying region 613, the second classifying region 614, . . . , and the nth classifying region 615, respectively. Under the (n+1)th disk 605, there is provided a carrier gas exhaust vent 612 for exhausting a carrier gas and classified ultra-fine particles. On the second disk 602, the circumference outer than the radius r2 and the first annular slits 607 is divided vertically into three portions. The upper portion of the three-way divided portions can have a positive or negative direct current voltage applied by a first direct current power supply 620 thereto, and the lower portion is grounded. Moreover, the middle portion is formed of an insulator 616 for insulating the upper and lower portions from each other, Similarly, on the (n+1)th disk 605, the circumference outer than the radius r(n+1) and the nth annular slits 610 is divided vertically into three portions. The upper portion of the three-way divided portions can have a positive or negative direct current voltage applied by an nth direct current power supply 622 thereto, and the lower portion is grounded. Moreover, the middle portion is formed of an insulator 616 for insulating the upper and lower portions from each other. In the disk type ultra-fine particle classifier, all the constituent portions other than the three-way divided portions of each of the disks from the aforementioned second disk 602 to the (n+1)th disk 605 are grounded.

Ultra-fine particles were classified by the following operation in the disk type ultra-fine particle classifier shown in FIG. 12. The first sheath gas 617, the second sheath gas 618, . . . , and the nth sheath gas 619 are introduced from the periphery of each disk into the first classifying region 613, the second classifying region 614, . . . , and the nth classifying region 615, respectively. Each of the introduced sheath gases passes through each classifying region in a laminar flow and then is exhausted from the sheath gas exhaust vent 611.

On the other hand, charged ultra-fine particles are transported by a carrier gas to be introduced through the annular guide slits 606 provided for the first disk 601 into the disc type ultra-fine particle classifier and then ejected into the first classifying region 613. In the first classifying region 613, an electrostatic field is established by the first direct current power supply 620 between the first disk 601 and the second disk 602 in a direction perpendicular to the direction of the first sheath gas flow. This causes the charged ultra-fine particles ejected from the annular guide slits 606 to be deflected from the first disk 601 toward the second disk 602 while being transported laterally by the first sheath gas 617 and drawing an orbit according to the electrical mobility which is dependent on the number of charges and particle diameter.

Only those deflected charged ultra-fine particles that have reached the first annular slits 607 provided on the second disk 602 are classified through the first classifying region 613 and then erected to the second classifying region 614. In the second classifying region 614, an electrostatic field is established by a second direct current power supply 621 between the second disk 602 and the third disk 603 in a direction perpendicular to the direction of the second sheath gas flow. This causes the charged ultra-fine particles ejected from the first annular slits 607 to be deflected from the second disk 602 toward the third disk 603 while being transported laterally by the second sheath gas 618 and drawing an orbit according to the electrical mobility Which is dependent on the number of charges and particle diameter. Only those deflected charged ultra-fine particles that have reached the second annular slits 608 provided on the third disk 603 are classified through the second classifying region 614 and then ejected to the third classifying region.

Similarly, in the nth classifying region 615, an electrostatic field is established by the nth direct current power supply 622 between the nth disk 604 and the (n+1)th disk 605 in a direction perpendicular to the direction of the nth sheath gas flow. This causes the charged ultra-fine particles ejected from the (n−1) annular slits 609 to be deflected from the nth disk 604 toward the (n+1)th disk 605 while being transported laterally by the nth sheath gas 619 and drawing an orbit according to the electrical mobility which is dependent on the number of charges and particle diameter. Only those deflected charged ultra-fine particles that have reached the nth annular slits 610 provided on the (n+1)th disk 605 are classified through the nth classifying region 615 and then taken out of the carrier gas exhaust vent 612.

In the disk type ultra-fine particle classifier shown in FIG. 12, the parameters (hereinafter referred to as the classifying parameters) related to the mean particle diameter and the classifying resolution of ultra-fine particles to be classified include the following parameters. That is, the parameters include the projected distance of the annular slits of the upper portion of a classifying region and the annular slits of the lower portion of the classifying region (corresponding to the difference of (rn−r(n+1)) in FIG. 12). The parameters also include the distance between two disks defining a space or a classifying region, the direct current voltage applied between two disks defining a space or a classifying region, the type of a carrier gas, the flow rate of the carrier gas, the type of a sheath gas, the flow rate of the sheath gas, and the like. Suppose that the same aforementioned classifying parameters are employed for the first classifying region 613 to the nth classifying region 615. In this case, all the classifying conditions become the same (the mean particle diameter and the classifying resolution of the ultra-fine particles to be classified). In other words, this means that the classifying resolution of the ultra-fine particles classified in the first classifying region 613 will never be improved even after the ultra-fine particles have passed through the second classifying region 614 and the nth classifying region 615.

In this context, the classifying parameter of each classifying region was made changeable, thereby making it possible to improve the classifying resolution of the ultra-fine particles passing through the multi-stage classifying regions. More specifically, made changeable were those classifying parameters such as the direct current voltage applied to two disks defining a space or a classifying region, the flow rate of a carrier gas, the flow rate of a sheath gas, and the type of the sheath gas. Now, a detailed explanation will be given below to a method for improving the classifying resolution of ultra-fine particles by changing the classifying parameters.

Figure 13A:
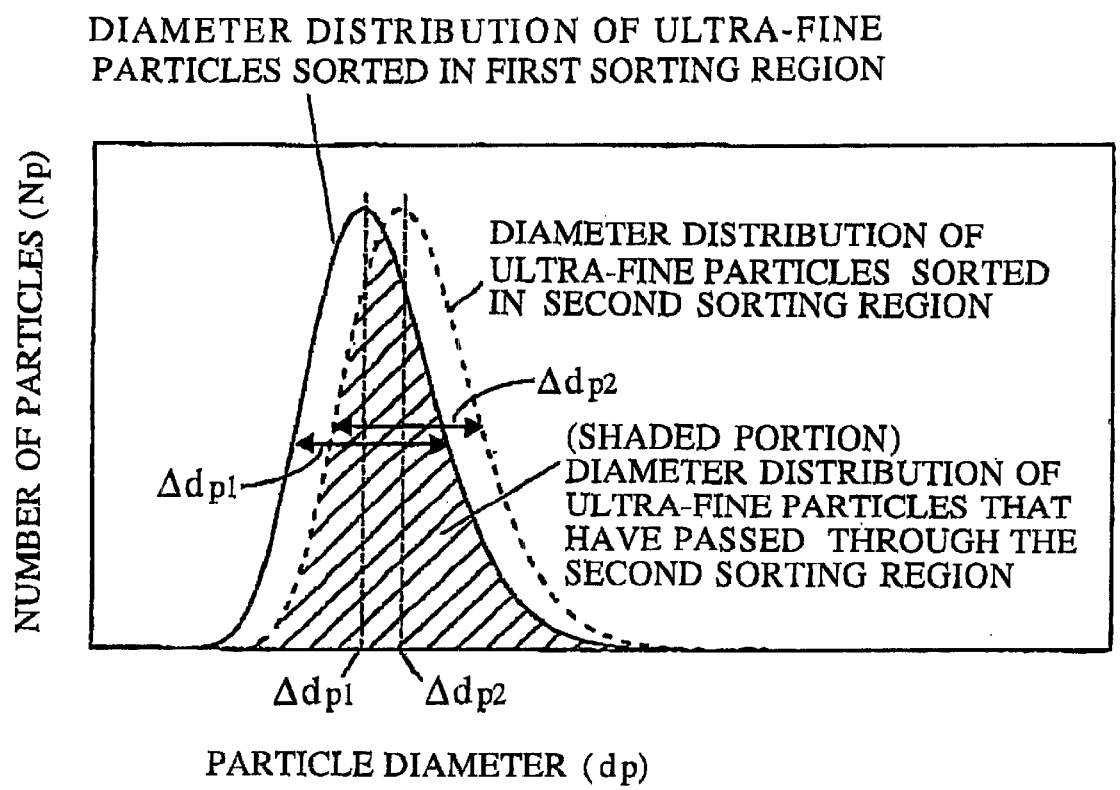
FIGS. 13($a$) and 13($b$) are schematic graphs illustrating the relationship between the number and diameter of the ultra-fine particles classified in each classifying region of the disk type ultra-fine particle classifier shown in FIG. 12.
Figure 13B:
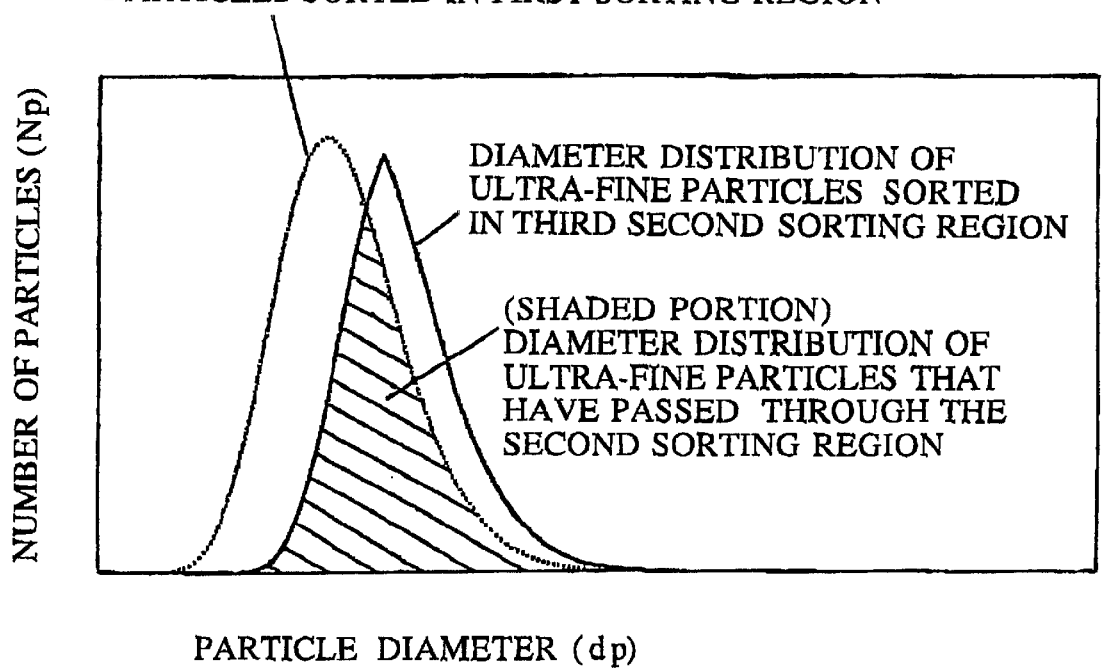

FIGS. 13(*a*) and 13(*b*) are schematic views illustrating the relationship between the number and diameter of the ultra-fine particles classified in each classifying region. As shown in FIG. 13(*a*), for example, the ultra-fine particles classified in the first classifying region 613, strictly speaking, do not have a single diameter but have a variance of Δdp1 about the mean particle diameter dp1. The mean particle diameter of the classified ultra-fine particles is dependent on the direct current voltage applied to the classifying region. Therefore, the direct current voltage applied to the second classifying region 614 is slightly shifted toward the negative or positive side from the direct current voltage applied to the first classifying region 613, thereby making it possible to shift slightly the mean particle diameter dp2 of the ultra-fine particles classified in the second classifying region 614 from dp1. Accordingly, this causes the variance of Δdp2 about the mean particle diameter dp2 to be slightly shifted from Δdp1. Therefore, for the ultra-fine particles classified in the second classifying region, it is possible to reduce any one of the variances either of those having particle diameters greater than dp1 or of those having particle diameters less than dp1.

Furthermore, as shown in FIG. 13(*b*), the direct current voltage applied to the third classifying region is slightly shifted toward the polarity opposite to the polarity to which the direct current voltage was shifted in the second classifying region 614, thereby making it possible to reduce the variance opposite to that reduced in the second classifying region. As a result, this has made it possible to provide a better classifying resolution than that of a disk type ultra-fine particle classifier comprising only one-stage classifying region.

Incidentally, in the subsequent classifying regions following the third classifying region, it is also possible to improve the classifying resolution by repeatedly shifting the applied voltage slightly from that of the classifying region in the previous stage in the same manner as in the second and third classifying regions.

As described above, charged ultra-fine particles move at a speed that in dependent on the particle diameter (i.e., the electrical mobility) in a direction perpendicular to disks from an upper disk to a lower disk. At the same time, the particles move at a constant transportation speed in conjunction with a sheath gas toward the center of and in parallel to the disks. As a result, the ultra-fine particles having a particle diameter distribution and ejected from the annular slits of the upper disk into the classifying region are distributed in particle diameter in parallel to and toward the center of the disks until the particles reach the lower disk. Only part of the ultra-fine particles distributed in particle diameter are classified through the annular slits of the lower disk and then taken out. Therefore, to improve the classifying resolution of ultra-fine particles, the distribution of particle diameters in parallel to the disks and toward the center of the disks should be made broader. In other words, the flow rate of the sheath gas should be made greater to make the transportation speed of the ultra-fine particles higher.

In this context, in the disk type ultra-fine particle classifier shown in FIG. 12, the flow rate of the sheath gas was made changeable in each classifying region and the classifying resolution was also made changeable. Furthermore, the flow rate of the second sheath gas was made higher than, that of the first sheath gas; the flow rate of the third sheath gas was made higher than that of the second sheath gas; . . . ; and the flow rate of the nth sheath gas was made higher than that of the (n−1)th sheath gas, thereby making it possible to gradually improve the classifying resolution. As a result, it was made possible to provide better classifying resolution than that of the disk type ultra-fine particle classifier comprising only one-stage classifying region.

For nm-sized ultra-fine particles, diffusion caused by the Brownian movement cannot be neglected in their transport process. In the disk type ultra-fine particle classifier shown in FIG. 12, the charged ultra-fine particles flowing from the annular slits of the upper disk into the classifying region are subjected to the diffusion caused by the Brownian movement until the particles reach the lower disk according to their individual electrical mobility. The Brownian movement causes the ultra-fine particles to diffuse totally at random (i.e., totally independent of the particle diameter) either in the direction of the flow of the sheath gas (i.e., from the periphery to the center of the disk) or in the opposite direction (i.e., from the center to the periphery of the disk). Therefore, the diffusion due to the Brownian movement in the classifying region causes the classifying resolution of ultra-fine particles to be reduced.

In general, the diffusion coefficient of the ultra-fine particles subjected to the diffusion due to the Brownian movement in a gas decreases with increasing viscosity of the gas. In addition, the diffusion coefficient decreases as the collision diameter of the gas atoms and molecules increases. Therefore, it is made possible to improve the classifying resolution of ultra-fine particles by selecting a sheath gas having high viscosity or a gas having larger collision diameters as the sheath gas flowing through the classifying region.

In this context, in the disk type ultra-fine particle classifier shown in FIG. 12, a He gas was used as the first sheath gas 617 in the first classifying region 613 and an Ar gas was used as the second sheath gas 618 in the second classifying region 614. Here, the He gas has a gas viscosity of $19.6 \times 10^{-6}$ Pa·s and a gas atom collision diameter of $2.15 \times 10^{-10}$ m, while the Ar gas has a gas viscosity of $22.3 \times 10^{-6}$ Pa·s and a gas atom collision diameter of $3.58 \times 10^{-10}$ m (where the gas viscosity is given under a pressure of 1 atm at a temperature of 20 degrees Celsius). This made it possible to exert less effect of the Brownian diffusion on the ultra-fine particles of the second classifying region 614 than those of first classifying region 613. As a result, it was made possible to improve the classifying resolution than that of the disk type ultra-fine particle classifier comprising only one-stage classifying region.

Incidentally, it is made also possible to further improve the classifying resolution of ultra-fine particles by employing, as the sheath gas, a gas of a much higher gas viscosity or a much larger collision diameter in the third classifying region and the subsequent classifying regions. For example, this can be achieved by using a Kr gas (of a gas atom collision diameter of $4.08 \times 10^{-10}$ m) as the third sheath gas in the third classifying region and a Xe gas (of a gas atom collision diameter of $4.78 \times 10^{-10}$ m) as the fourth sheath gas in the fourth classifying region.

The flow rate of a carrier gas for transporting ultra-fine particles also has effect on the classifying resolution of the ultra-fine particles. The carrier gas flows into a classifying region from the annular slits of the upper disk in conjunction with the ultra-fine particles. A higher flow rate of the carrier gas would give a higher initial speed to the ultra-fine particles, flowing into the classifying region from the upper annular slits, in the direction from the upper disk to the lower disk. The aforementioned direction of the initial speed equals to the direction of the speed caused by the electrical mobility. This causes an error corresponding to the magnitude of the aforementioned initial speed to occur in the distance over which the ultra-fine particles move from the upper to the lower disk, thereby reducing the classifying resolution.

On the other hand, a lower flow rate of the carrier gas would present a problem of the occurrence of mutual association and cohesion of the ultra-fine particles due to the Brownian diffusion. The higher the initial concentration of the ultra-fine particles and the smaller the initial particle diameter, the earlier in time the aforementioned cohesion takes place. In the process in which nm-sized ultra-fine particles generated somehow are transported to the disk type ultra-fine particle classifier shown in FIG. 12, a longer time of transportation causes the particle diameter to be changed due to the mutual association and cohesion of the ultra-fine particles before the particles are classified in the disk type ultra-fine particle classifier. To prevent this from taking place, it is necessary to increase the flow rate of the carrier gas for transporting the ultra-fine particles to shorten the aforementioned transportation time.

In order to solve the aforementioned mutually contradictory two problems (i.e., a reduction in classifying resolution at a high flow rate of the carrier gas and cohesion taking place at a low flow rate of the carrier gas), the flow rates of a carrier gas flowing into each classifying region were made different from each other in the disk type ultra-fine particle classifier shown in FIG. 12. Then, the ultra-fine particles were classified in the following procedure. The flow rate of the carrier gas flowing from the annular guide slits 606 of the first disk 601 into the first classifying region 613 was made higher, thereby preventing the effect of the cohesion taking place until the generated ultra-fine particles are transported to the disk type ultra-fine particle classifier. The particle concentration of the ultra-fine particles classified in the first classifying region 613 is lower than that of the particles upstream of the annular guide slits 606. That is, the ultra-fine particles classified in the first classifying region 613 require a longer time for cohesion than the ultra-fine particles upstream of the annular guide slits 606. Therefore, the flow rate of the carrier gas flowing from the first annular slits 607 into the second classifying region 614 was made lower than the flow rate of the carrier gas flowing into the first classifying region 613, thereby providing an improved classifying resolution. As described above, the flow rate of a carrier gas flowing in from annular slits was made lower toward the end stage of classifying region, thereby solving the problem of mutual cohesion and a reduction in classifying resolution of the ultra-fine particles.

Nm-sized ultra-fine particles are very sensitive to the contamination of impurities due to less number of constituent atoms and a high ratio of the number of atoms exposed to the surface to that of internal atoms. In this context, in the disk type ultra-fine particle classifier shown in FIG. 12, the insulator 616 was formed of a ceramic-based substance and all other portions were formed of metal, thereby making it possible to bake the ultra-fine particle classifier at high temperatures under a high vacuum. This made it possible to keep the inside of the ultra-fine particle classifier clean and prevent impurities from finding their way into the ultra-fine particles.

The present invention has been explained in terms of preferred embodiments illustrated in the accompanying drawings. However, it is obvious for those skilled in the art that variations and modifications may be readily made to the invention. It is to be understood that all such variations are intended to be within the scope of the invention.

What is claimed is:

1. An apparatus for fabricating a quantum dot functional structure comprising
a fine particle generating chamber for generating fine particles,
a fine particle classifying chamber for classifying the fine particles generated in said fine particle generating chamber according to a desired particle diameter in a gas,
gas exhaust means for exhausting a gas for transporting said fine particles,
transparent medium generating means for generating a transparent medium, and
a depositing chamber for collecting the fine particles classified in said fine particle classifying chamber onto a substrate as well as for collecting the transparent medium generated by said transparent medium generating means onto said substrate and for depositing said classified fine particles and said transparent medium onto said substrate;
further comprising an ultra-fine particle classifier wherein a classifying region employs a space defined between two concentric disks, spaced apart from each other and arranged in parallel to each other; charged ultra-fine particles are classified in said classifying region by making use of electrical mobility being dependent on a particle diameter of charged particles upon application of an electrostatic field thereto in a viscous fluid; and three or more of said concentric disks are arranged to thereby constitute said classifying region by two or more multi-stages.

2. The apparatus for fabricating a quantum dot functional structure according to claim 1, wherein said transparent medium generating means is composed of a first transparent medium generating means arranged in said depositing chamber, and a second transparent medium generating chamber.

3. The apparatus for fabricating a quantum dot function structure according to claim 1, wherein the fine particle generating chamber, the fine particle classifying chamber, and a transparent path of fine particles in the depositing chamber are constructed on a straight line.

4. The apparatus for fabricating a quantum dot functional structure according to claim 1, wherein a pressure of the fine particle generating chamber and a pressure of the depositing chamber are controlled independently.

5. The apparatus for fabricating a quantum dot functional structure according to claim 1, wherein the gas exhaust means is controlled in accordance with a pressure of the depositing chamber.

6. The apparatus for fabricating a quantum dot functional structure according to claim 1, wherein the substrate in the depositing chamber is rotatable with respect to a direction of deposition of the fine particles and transparent medium.

7. The apparatus for fabricating a quantum dot functional structure according to claim 1, further comprising a temperature control mechanism being capable of maintaining a transport path of fine particles at a constant temperature.

8. An apparatus for fabricating a quantum dot functional structure according to claim 1,
wherein at least one of the fine particles and the transparent medium is generated using laser ablation, and a plasma plume produced upon generation is observed using a charge coupled device.

9. The apparatus for fabricating a quantum dot functional structure according to claim 1, wherein at least one of the generated fine particles and the transparent medium is radiated with ultraviolet light to observe fluorescent light.

10. The apparatus for fabricating a quantum dot functional structure according to claim 1, wherein the disk is formed of ceramic-based insulator and metal.

11. The apparatus for fabricating a quantum dot functional structure according to claim 1, wherein a direct current voltage can be individually applied to each stage of a multi-stage classifying region.

12. The apparatus for fabricating a quantum dot functional structure according to claim 1, wherein a disk for partitioning the multi-stage classifying region is provided with slits for allowing a carrier gas to flow from one classifying region into another classifying region.

13. The apparatus for fabricating a quantum dot functional structure according to claim 12, wherein the carrier gas flows at different flow rates into each stage of the multi-stage classifying region.

14. The apparatus for fabricating a quantum dot functional structure according to claim 12, wherein as the number of stages of the multi-stage classifying region increases, a flow rate of the carrier gas flowing into each stage decreases.

15. The apparatus for fabricating a quantum dot functional structure according to claim 1, wherein a sheath gas flows from a periphery portion of the disk toward a central portion of the classifying region.

16. The apparatus for fabricating a quantum dot functional structure according to claim 15, wherein different types of the sheath gas are employed in each stage of the multi-stage classifying region.

17. The apparatus for fabricating a quantum dot functional structure according to claim 15, wherein as the number of stages of the multi-stage classifying region increases, viscosity or a collision diameter of the sheath gas of each stage increases.

18. The apparatus for fabricating a quantum dot functional structure according to claim 15, wherein the sheath gas flows through each stage of the multi-stage classifying region at different flow rates.

19. The apparatus for fabricating a quantum dot functional structure according to claim 18, wherein as the number of stages of the multi-stage classifying region increases, a flow rate of the sheath gas flowing into each stage increases.

20. The apparatus for fabricating a quantum dot functional structure comprising:
- a fine particle generating chamber for generating fine particles,
- a fine particle classifying chamber for classifying the fine particles generated in said fine particle generating chamber according to a desired particle diameter in a gas,
- gas exhaust means for exhausting a gas for transporting said fine particles,
- transparent medium generating means for generating a transparent medium, and
- a depositing chamber for collecting the fine particles classified in said fine particle classifying chamber onto a substrate as well as for collecting the transparent medium generated by said transparent medium generating means onto said substrate and for depositing said classified fine particles and said transparent medium onto said substrate,
- wherein the apparatus has an ultra-fine particle classifier including:
  - a plurality of disks, arranged concentrically in parallel to each other, for defining therebetween a multi-stage classifying region for classifying the ultra-fine particles;
  - slits, formed on said disks, for introducing a carrier gas and the ultra-fine particles into a subsequent stage classifying region through each of the disks,
  - a sheath gas exhaust vent, provided at an axis portion of each disk, for exhausting the sheath gas flowing from a periphery of each disk into each classifying region, and
  - a carrier gas exhaust vent, provided on a lower portion of the last stage disk, for exhausting a carrier gas and classified ultra-fine particles,
  - said ultra-fine particle classifier classifying charged ultra-fine particles in said classifying regions.

21. The apparatus for fabricating a quantum dot functional structure according to claim 20, wherein a circumferential portion of the plural disks is three-way divided into upper, middle and portions vertically with respect to a surface of each of the disks, the upper portion of the three-way divided circumferential portion of said disk having a direct current voltage applied thereto, the lower portion thereof being grounded, and the middle portion thereof being constructed to electrically insulate the upper and lower portions from each other.

* * * * *

UNITED STATES PATENT AND TRADEMARK OFFICE
CERTIFICATE OF CORRECTION

PATENT NO. : 6,648,975 B2
DATED : November 18, 2003
INVENTOR(S) : Nobuyasu Suzuki et al.

It is certified that error appears in the above-identified patent and that said Letters Patent is hereby corrected as shown below:

<u>Title page,</u>
Item [73], Assignees, delete "Agency of" and insert therefor -- Japan as Represented by Director General of National Institute of Advanced --.

Signed and Sealed this

Twelfth Day of October, 2004

JON W. DUDAS
*Director of the United States Patent and Trademark Office*